(12) United States Patent  
Tobita et al.

(10) Patent No.: US 12,342,465 B2  
(45) Date of Patent: Jun. 24, 2025

(54) WIRING BOARD

(71) Applicant: Murata Manufacturing Co., Ltd., Kyoto (JP)

(72) Inventors: Yoshiki Tobita, Nagaokakyo (JP); Issei Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 201 days.

(21) Appl. No.: 18/359,227

(22) Filed: Jul. 26, 2023

(65) Prior Publication Data

US 2023/0371183 A1    Nov. 16, 2023

Related U.S. Application Data

(63) Continuation of application No. PCT/JP2021/048933, filed on Dec. 28, 2021.

(30) Foreign Application Priority Data

Jan. 29, 2021  (JP) .................. 2021-013328

(51) Int. Cl.  
*H05K 1/11* (2006.01)  
*H05K 1/16* (2006.01)

(52) U.S. Cl.  
CPC ............ *H05K 1/165* (2013.01); *H05K 1/115* (2013.01)

(58) Field of Classification Search  
CPC ...... H05K 1/115; H05K 1/165; H05K 1/0233; H05K 1/111; H05K 2201/086;

(Continued)

(56) References Cited

U.S. PATENT DOCUMENTS

| 2008/0001287 A1 | 1/2008 | Nakashiba |
| 2013/0113595 A1* | 5/2013 | Otsubo ............... H01F 17/0013 336/200 |
| 2018/0211765 A1 | 7/2018 | Nakaniwa et al. |

FOREIGN PATENT DOCUMENTS

| JP | 2008-205422 A | 9/2008 |
| JP | 2009-218469 A | 9/2009 |

(Continued)

OTHER PUBLICATIONS

International Search Report for PCT/JP2021/048933 dated Mar. 29, 2022.

*Primary Examiner* — Roshn K Varghese  
(74) *Attorney, Agent, or Firm* — McDonald Hopkins LLC

(57) ABSTRACT

A wiring board includes at least one insulating layer, plurality of conductive members, at least one land electrode formed at position overlapping first surface in plan view of insulating layer as viewed from first surface side, land electrode being connected to each of at least one conductive member, and coil conductor provided inside insulating layer or on second surface on back side of first surface in insulating layer and having winding axis intersecting first surface. Plurality of conductive members includes first conductive member at position where at least part of the first conductive member overlaps opening of the coil conductor in plan view seen from first surface side, and second conductive member at position deviated from opening of coil conductor in plan view seen from first surface side. Area of first conductive member is smaller than area of second conductive member in plan view seen from first surface side.

20 Claims, 13 Drawing Sheets

(58) Field of Classification Search
CPC .. H05K 2201/10265; H05K 2201/0792; H01F 27/2804; H01F 17/0013; H01F 17/0006; H01L 23/5227
See application file for complete search history.

(56) References Cited

FOREIGN PATENT DOCUMENTS

| WO | 2016/136653 A1 | 9/2016 |
| WO | 2017/006784 A1 | 1/2017 |
| WO | 2017/110460 A1 | 6/2017 |

\* cited by examiner

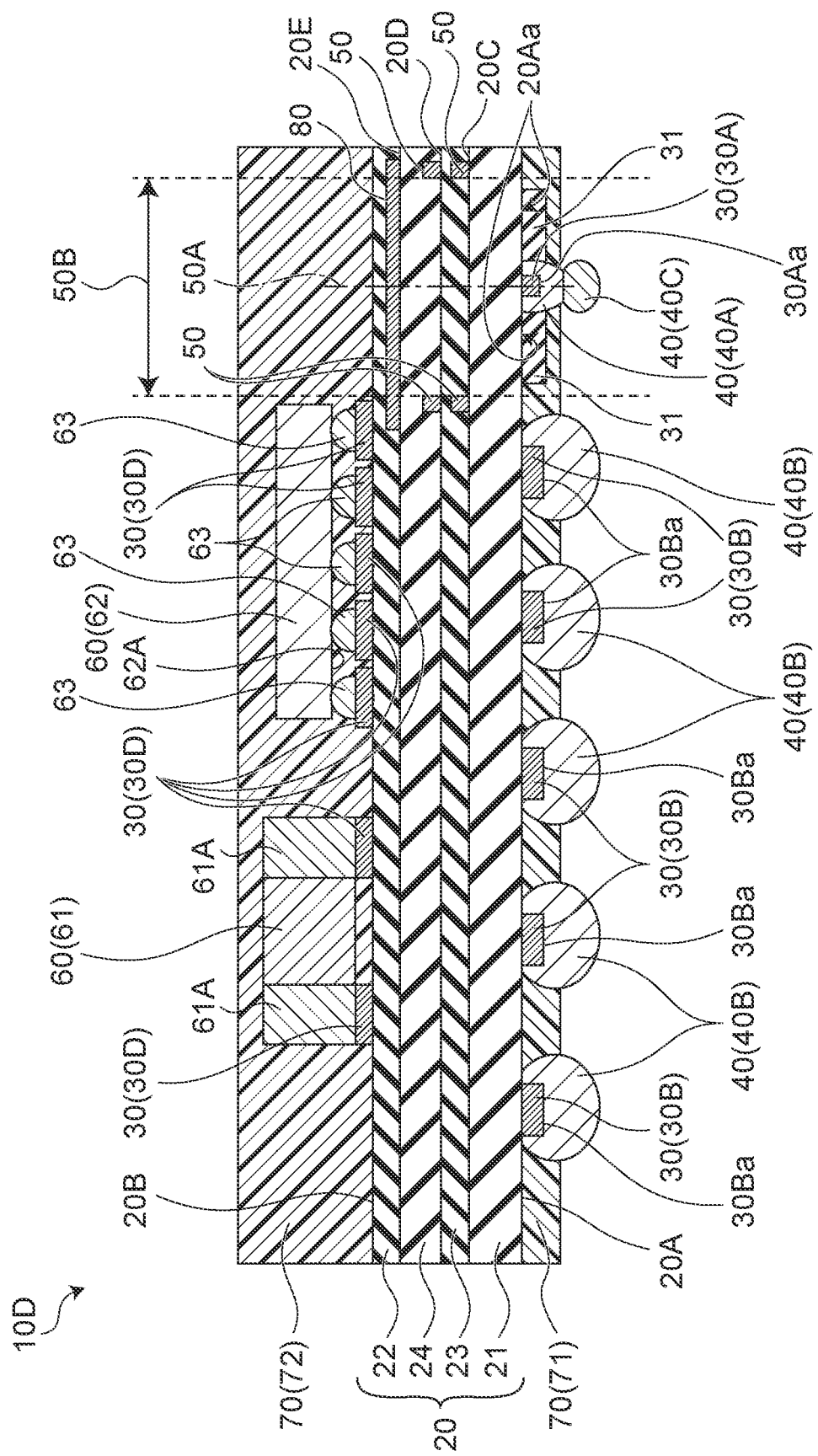

WIRING BOARD

CROSS REFERENCE TO RELATED APPLICATION

This is a continuation of International Application No. PCT/JP2021/048933 filed on Dec. 28, 2021 which claims priority from Japanese Patent Application No. 2021-013328 filed on Jan. 29, 2021. The contents of these applications are incorporated herein by reference in their entireties.

BACKGROUND OF THE DISCLOSURE

Field of the Disclosure

The present disclosure relates to a wiring board including a coil conductor and a conductive member.

Description of the Related Art

A board having a coil conductor is disclosed in Patent Document 1. The board includes a thin film inductive element having a spiral shape as a coil conductor. In addition, on the board, solder balls are provided as conductive members on the thin film inductive element.

Patent Document 1: JP 2009-218469 A

BRIEF SUMMARY OF THE DISCLOSURE

The solder ball faces the thin film inductive element in the direction of the winding axis of the thin film inductive element. Therefore, the solder ball affects a magnetic flux formed when a current flows through the thin film inductive element.

When a large number of boards are manufactured, the diameters of the solder balls formed on the respective boards vary. When the diameter of the solder ball varies, the magnetic flux formed by the thin film inductive element varies for each board. That is, due to variations in the diameters of the solder balls, variations occur in the performance of many manufactured boards.

Therefore, a possible benefit of the present disclosure is to solve the above problem, and to provide a wiring board capable of reducing an influence of variation in size of a conductive member on a coil conductor.

In order to solve the problem, a wiring board according to the present disclosure includes: at least one insulating layer; a plurality of conductive members; at least one land electrode formed at a position overlapping a first surface in plan view of the insulating layer as viewed from the first surface side, the at least one land electrode being connected to each of the at least one conductive member; and a coil conductor provided inside the insulating layer or on a second surface on a back side of the first surface in the insulating layer and having a winding axis intersecting the first surface, in which the plurality of conductive members includes: a first conductive member at a position where at least a part of the first conductive member overlaps an opening of the coil conductor in plan view seen from the first surface side; and a second conductive member at a position deviated from the opening of the coil conductor in plan view seen from the first surface side, and an area of the first conductive member is smaller than an area of the second conductive member in plan view seen from the first surface side.

According to the present disclosure, it is possible to reduce the influence of the variation in size of the conductive member on the coil conductor.

BRIEF DESCRIPTION OF THE SEVERAL VIEWS OF THE DRAWINGS

FIG. 13 is a cross-sectional view illustrating a cross section of a wiring board according to a fifth embodiment of the present disclosure at a position corresponding to an A-A cross section in FIG. 1.

DETAILED DESCRIPTION OF THE DISCLOSURE

Figure 1:
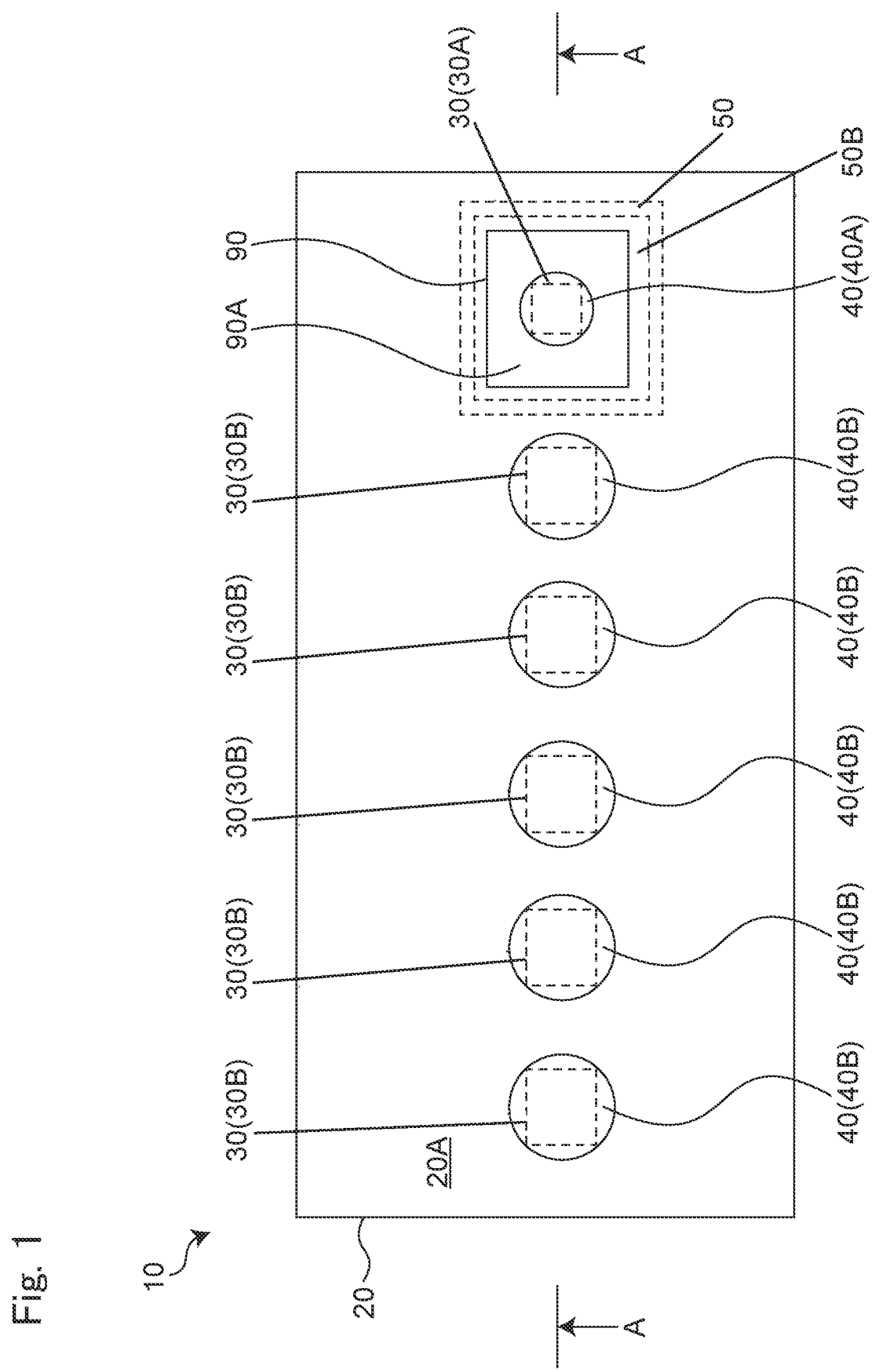
FIG. 1 is a bottom view of a wiring board according to a first embodiment of the present disclosure.

A wiring board according to one aspect of the present disclosure includes: at least one insulating layer; a plurality of conductive members; at least one land electrode formed at a position overlapping a first surface in plan view of the insulating layer as viewed from the first surface side, the at least one land electrode being connected to each of the at least one conductive member; and a coil conductor provided inside the insulating layer or on a second surface on a back side of the first surface in the insulating layer and having a winding axis intersecting the first surface, in which the plurality of conductive members includes: a first conductive member at a position where at least a part of the first conductive member overlaps an opening of the coil conductor in plan view seen from the first surface side; and a second conductive member at a position deviated from the opening of the coil conductor in plan view seen from the first surface side, and an area of the first conductive member is smaller than an area of the second conductive member in plan view seen from the first surface side.

The variation in size of the conductive member formed on the surface of each land electrode may affect the magnetic flux formed by the coil conductor. The smaller the conductive member, the smaller the variation in size of the conductive member.

According to this configuration, in plan view seen from the first surface side, the first conductive member is at a position overlapping the opening of the coil conductor. Therefore, the variation in size of the first conductive member can greatly affect the magnetic flux formed by the coil conductor. On the other hand, in the plan view, the second conductive member is at a position deviated from the opening of the coil conductor. Therefore, the second conductive member does not greatly affect the magnetic flux formed by the coil conductor.

According to this configuration, the area of the first conductive member is smaller than the area of the second conductive member in plan view seen from the first surface side. As a result, when there is a variation in size of the conductive member, the variation in size of the first conductive member can be made smaller than the variation in size of the second conductive member. Therefore, the influence of the variation in size of the conductive member on the magnetic flux formed by the coil conductor can be reduced.

In addition, according to this configuration, it is possible to reduce the influence of the first conductive member on the magnetic flux formed by the coil conductor as compared with the case where the area of the first conductive member is larger than the area of the second conductive member in plan view seen from the first surface side. Therefore, the performance of the coil conductor and the wiring board can be improved.

In plan view seen from the first surface side, an area of the first conductive member may be smaller than an area of the opening of the coil conductor.

According to this configuration, it is possible to reduce the influence of the first conductive member on the magnetic flux formed by the coil conductor as compared with the case where the area of the first conductive member is larger than the area of the opening of the coil conductor in the plan view seen from the first surface side. Therefore, the performance of the coil conductor and the wiring board can be improved.

In plan view seen from the first surface side, an area of the first conductive member may be larger than an area of the land electrode to which the first conductive member is connected.

The conductive member located behind the land electrode as viewed from the coil conductor has a small influence on the magnetic flux formed by the coil conductor. On the other hand, the conductive member not located behind the land electrode but located outside the land electrode as viewed from the coil conductor has a large influence on the magnetic flux formed by the coil conductor.

According to this configuration, when viewed from the coil conductor, a part of the first conductive member is located outside the land electrode to which the first conductive member is connected. Therefore, the influence of the variation in size of the first conductive member on the magnetic flux formed by the coil conductor increases.

However, in this configuration, since the area of the first conductive member is smaller than the area of the second conductive member in plan view seen from the first surface side, the influence of the variation in size of the first conductive member on the magnetic flux formed by the coil conductor can be reduced. Therefore, the influence of the variation in size of the conductive member on the magnetic flux formed by the coil conductor can be reduced.

The wiring board according to one aspect of the present disclosure may further include an insulating covering portion surrounding the land electrode to which the first conductive member is connected in plan view seen from the first surface side, and the first conductive member may be surrounded by the covering portion in plan view seen from the first surface side.

According to this configuration, wet-spreading of the first conductive member is reduced by the covering portion. Therefore, the area of the first conductive member can be suppressed from becoming larger than the area of the second conductive member in plan view seen from the first surface side.

The distance between the surface of the land electrode to which the first conductive member is connected and the first surface may be longer than the distance between the surface of the land electrode to which the second conductive member is connected and the first surface.

In order to make the area of the first conductive member smaller than the area of the second conductive member in plan view seen from the first surface side, it is conceivable to reduce the amount of the material forming the first conductive member to be smaller than the amount of the material forming the second conductive member. At this time, the thickness of the first conductive member may be smaller than the thickness of the second conductive member. In such a case, a difference in position in a direction orthogonal to the first surface of the insulating layer occurs between a portion farthest from the first surface in the first conductive member and a portion farthest from the first surface in the second conductive member.

The wiring board is used by being mounted on another board, for example, a mother board. At this time, in the wiring board having the above-described difference in position, the possibility of occurrence of a mounting failure increases.

According to this configuration, the distance between the surface of the land electrode to which the first conductive member is connected and the first surface is longer than the distance between the surface of the land electrode to which the second conductive member is connected and the first surface. Therefore, even when the thickness of the first conductive member is smaller than the thickness of the second conductive member, the position of the portion of the first conductive member farthest from the first surface can be aligned with the position of the portion of the second conductive member farthest from the first surface in the direction orthogonal to the first surface of the insulating layer. Therefore, the possibility of occurrence of mounting failure can be reduced.

The wiring board according to one aspect of the present disclosure may include a third conductive member formed on a side of the first conductive member opposite to the land electrode.

According to this configuration, the wiring board includes the third conductive member formed on a side of the first conductive member opposite to the land electrode. As a result, even when the thickness of the first conductive member is smaller than the thickness of the second conductive member, the position of the portion farthest from the first surface in the third conductive member and the position of the portion farthest from the first surface in the second conductive member can be aligned in the direction orthogonal to the first surface of the insulating layer. Therefore, the possibility of occurrence of mounting failure can be reduced.

The plurality of conductive members may include a plurality of the first conductive members at positions overlapping the opening of the coil conductor in plan view seen from the first surface side.

According to this configuration, when there is a variation in size of the plurality of first conductive members, it is possible to reduce the influence of the variation on the magnetic flux formed by the coil conductor. In addition, since the influence of the first conductive member on the magnetic flux formed by the coil conductor is reduced, the performance of the coil conductor and the wiring board can be improved.

The wiring board according to one aspect of the present disclosure may further include a first sealing resin provided on the first surface of the insulating layer and covering a part of the conductive member.

According to this configuration, the conductive member can be stably fixed to the land electrode by the first sealing resin.

The wiring board according to one aspect of the present disclosure may further include at least one electronic component mounted on the second surface of the insulating layer.

The wiring board according to one aspect of the present disclosure may further include a second sealing resin provided on the second surface of the insulating layer and covering at least a part of the electronic component.

According to this configuration, the electronic component can be stably fixed to the insulating layer by the second sealing resin.

The coil conductor may be provided inside the insulating layer, and the electronic component may be at a position deviated from the opening of the coil conductor in plan view seen from the second surface side.

According to this configuration, in plan view seen from the second surface side, the electronic component is at a position deviated from the opening of the coil conductor. Therefore, the influence of the magnetic flux formed by the coil conductor on the electronic component can be reduced.

The wiring board according to one aspect of the present disclosure may include a plurality of the land electrodes. In addition, the coil conductor may be provided inside the insulating layer. In addition, the electronic component may include an overlapping component at least partially overlapping the opening of the coil conductor in plan view seen from the second surface side, and a non-overlapping component at a position deviated from the opening of the coil conductor in plan view seen from the second surface side. In addition, each of the overlapping component and the non-overlapping component may include at least one conductive portion exposed to the outside. In addition, the plurality of land electrodes may further include: an overlapping electrode formed on the second surface of the insulating layer, at a position overlapping the opening of the coil conductor in plan view seen from the second surface side, and connected with the conductive portion of the overlapping component; and a non-overlapping electrode formed on the second surface of the insulating layer, at a position deviated from the opening of the coil conductor in plan view seen from the second surface side, and connected with the conductive portion of the overlapping component at a position deviated from the opening of the coil conductor or the conductive portion of the non-overlapping component. In addition, in plan view seen from the second surface side, an area of the conductive portion connected to the overlapping electrode may be smaller than an area of the conductive portion connected to the non-overlapping electrode.

According to this configuration, in plan view seen from the second surface side, the overlapping electrode is at a position overlapping the opening of the coil conductor. Therefore, the conductive portion connected to the overlapping electrode can greatly affect the magnetic flux formed by the coil conductor. On the other hand, in the plan view, the non-overlapping electrode is at a position deviated from the opening of the coil conductor. Therefore, the conductive portion connected to the non-overlapping electrode does not greatly affect the magnetic flux formed by the coil conductor.

According to this configuration, in plan view seen from the second surface side, the area of the conductive portion connected to the overlapping electrode is smaller than the area of the conductive portion connected to the non-overlapping electrode. Therefore, when there is a variation in size of the conductive portion, the variation in size of the conductive portion connected to the overlapping electrode can be made smaller than the variation in size of the conductive portion connected to the non-overlapping electrode. Therefore, the influence of the variation in size of the conductive portion on the magnetic flux formed by the coil conductor can be reduced.

In plan view seen from the second surface side, an area of the conductive portion connected to the overlapping electrode may be larger than an area of the overlapping electrode.

According to this configuration, when viewed from the coil conductor, a part of the conductive portion connected to the overlapping electrode is located outside the overlapping electrode. Therefore, the influence of the variation in size of the conductive portion connected to the overlapping electrode on the magnetic flux formed by the coil conductor becomes large.

However, in this configuration, since the area of the conductive portion connected to the overlapping electrode is smaller than the area of the conductive portion connected to the non-overlapping electrode in plan view seen from the second surface side, the influence of the variation in size of the conductive portion connected to the overlapping electrode on the magnetic flux formed by the coil conductor is reduced.

Hereinafter, embodiments of the present disclosure will be described with reference to the drawings. Note that the present disclosure is not limited to the following embodiments.

In addition, in the drawings, substantially the same elements are denoted by the same reference numerals, and description thereof is omitted.

Hereinafter, for convenience of description, terms indicating directions such as "upper surface", "lower surface", and "vertical direction" are used, but these terms are not intended to limit a use state or the like of the electronic component according to the present disclosure.

First Embodiment

Figure 2:
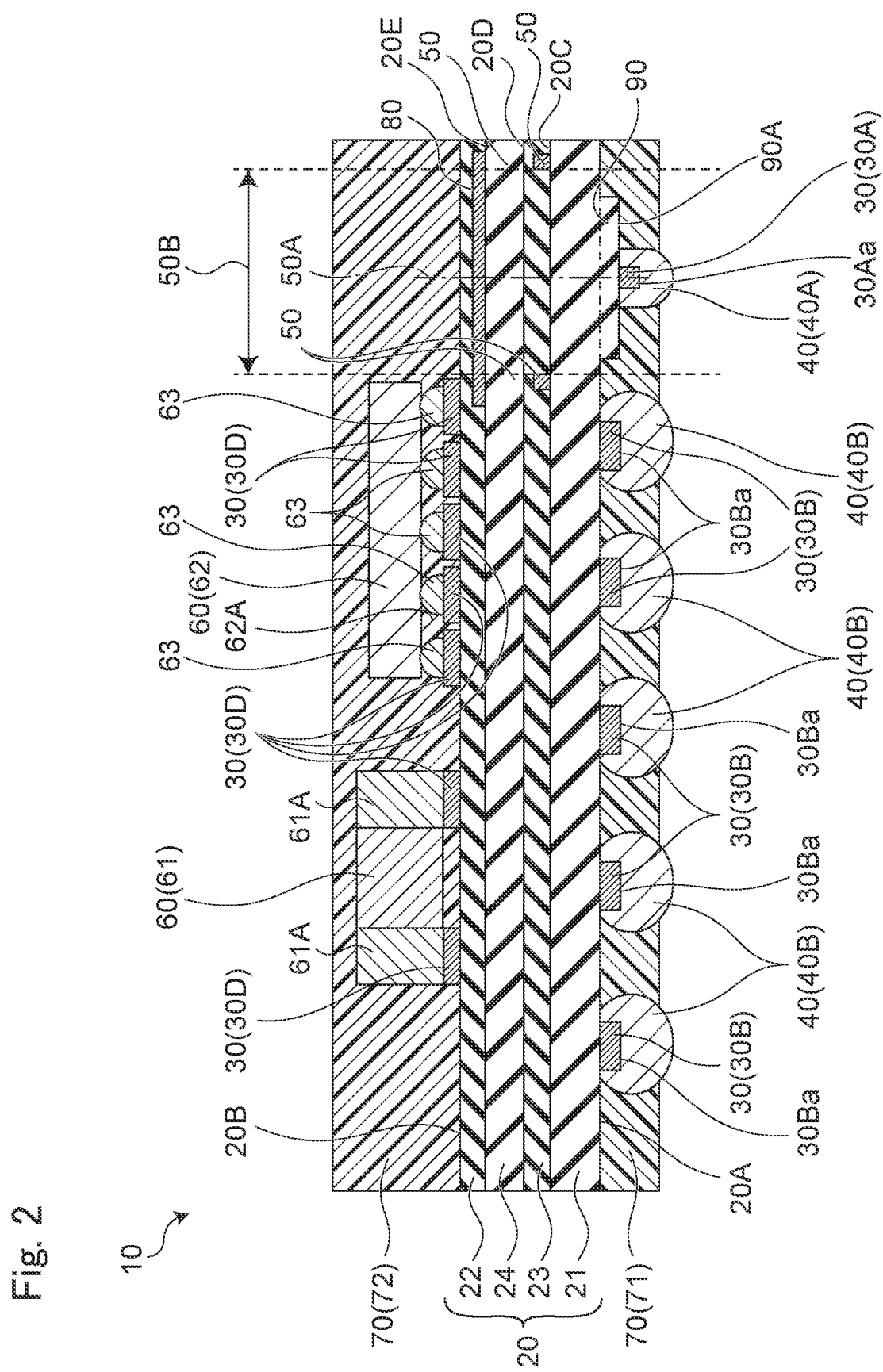
FIG. 2 is a cross-sectional view illustrating a cross section taken along line A-A in FIG. 1.

FIG. 1 is a bottom view of a wiring board according to a first embodiment of the present disclosure. FIG. 2 is a cross-sectional view illustrating a cross section taken along line A-A in FIG. 1.

As illustrated in FIGS. 1 and 2, a wiring board 10 includes an insulating layer 20, a land electrode 30, a solder ball 40, a coil conductor 50, a ground conductor 80, an electronic component 60, and a sealing resin 70.

The insulating layer 20 is a base material of an insulator made of ceramic such as alumina, or resin such as glass epoxy, Teflon (registered trademark), or paper phenol.

In the first embodiment, as illustrated in FIG. 2, the insulating layer 20 includes four layers. The insulating layer 20 includes a first surface layer 21, a second surface layer 22, and intermediate layers 23 and 24 laminated between the first surface layer 21 and the second surface layer 22. The intermediate layer 23 is laminated on the first surface layer 21. The intermediate layer 24 is laminated on the side of the intermediate layer 23 opposite to the first surface layer 21. The second surface layer 22 is laminated on the side of the intermediate layer 24 opposite to the intermediate layer 23.

The surface on a side of the first surface layer 21 opposite to the intermediate layer 23 constitutes a lower surface 20A of the insulating layer 20. The lower surface 20A is an example of the first surface. The surface on a side of the second surface layer 22 opposite to the intermediate layer 24 constitutes an upper surface 20B of the insulating layer 20. The upper surface 20B is an example of the second surface. The lower surface 20A and the upper surface 20B are exposed to the outside of the insulating layer 20. The upper surface 20B is a surface on the back side of the lower surface 20A.

As illustrated in FIGS. 1 and 2, a stepped portion 90 protruding in a direction intersecting the lower surface 20A from the lower surface 20A is formed on the lower surface 20A of the insulating layer 20. The stepped portion 90 is formed of the same material as the material forming the insulating layer 20, and is integrated with the insulating layer 20.

As illustrated in FIG. 2, a plurality of land electrodes 30 are formed on the lower surface 20A and the upper surface 20B of the insulating layer 20, and a surface 90A that is a surface on a side of the stepped portion 90 opposite to first surface layer 21.

When the insulating layer 20 is made of ceramic, the land electrode 30 is obtained by co-firing a conductive paste printed on the lower surface 20A and the upper surface 20B of the insulating layer 20 and the surface 90A of the stepped portion 90 with the insulating layer 20. In this case, the land electrode 30 is made of, for example, copper. When the insulating layer 20 is made of resin, the land electrode 30 is formed on the lower surface 20A and the upper surface 20B of the insulating layer 20 and the surface 90A of the stepped portion 90 by a known means such as etching. In this case, the land electrode 30 is made of metal foil, for example.

In the first embodiment, the wiring board 10 includes 13 land electrodes 30. The land electrode 30 includes one electrode 30A, five electrodes 30B, and seven electrodes 30D. The electrode 30D is an example of a non-overlapping electrode.

As illustrated in FIGS. 1 and 2, the electrode 30A is formed on the surface 90A of the stepped portion 90. Since the stepped portion 90 is formed on the lower surface 20A of the insulating layer 20, the electrode 30A is formed at a position overlapping the lower surface 20A in plan view seen from the lower surface 20A side of the insulating layer 20. On the other hand, the electrode 30B is formed on the lower surface 20A of the insulating layer 20.

A surface 30Aa of the electrode 30A is a surface on a side of the electrode 30A opposite to the stepped portion 90. A surface 30Ba of the electrode 30B is a surface on a side of the electrode 30B opposite to the first surface layer 21.

As illustrated in FIG. 2, since the electrode 30A is formed on the surface 90A of the stepped portion 90, the distance between the surface 30Aa of the electrode 30A and the lower surface 20A of the insulating layer 20 is longer than the distance between the surface 30Ba of the electrode 30B and the lower surface 20A of the insulating layer 20.

The electrode 30D is formed on the upper surface 20B of the insulating layer 20.

As illustrated in FIG. 1, in plan view of the wiring board 10 as viewed from below, in other words, in plan view of the wiring board 10 as viewed from the lower surface 20A side of the insulating layer 20, the area of the electrode 30A is smaller than the area of the electrode 30B.

As illustrated in FIGS. 1 and 2, the wiring board 10 includes six solder balls 40. The solder ball 40 includes one solder ball 40A and five solder balls 40B. The solder ball 40A is an example of the first conductive member. The solder ball 40B is an example of the second conductive member. The solder ball 40 is made of solder.

The solder ball 40A is formed on the front surface 30Aa of the electrode 30A. The solder ball 40B is formed on the front surface 30Ba of the electrode 30B.

The solder balls 40A are smaller than the respective solder balls 40B. The solder ball 40 has a substantially spherical shape. Therefore, as illustrated in FIG. 1, in plan view of the wiring board 10 as viewed from the lower surface 20A side of the insulating layer 20, the area of the solder balls 40A is smaller than the area of the solder balls 40B.

As illustrated in FIG. 1, the solder ball 40A is formed so as to cover the entire surface 30Aa of the electrode 30A. That is, in plan view of the wiring board 10 as viewed from the lower surface 20A side of the insulating layer 20, the entire portion of the electrode 30A overlaps the solder ball 40A. That is, in the plan view, the area of the solder ball 40A is larger than the area of the electrode 30A.

As illustrated in FIG. 2, the thickness of the stepped portion 90 in the vertical direction is substantially the same as the difference between the diameter of the solder ball 40A and the diameter of the solder ball 40B. Therefore, the position of the lower end portion of the solder ball 40A in the vertical direction is substantially the same as the position of the lower end portion of the solder ball 40B in the vertical direction. The thickness of the stepped portion 90 in the vertical direction may be larger or smaller than the difference between the diameter of the solder ball 40A and the diameter of the solder ball 40B. That is, the position in the vertical direction of the lower end portion of the solder ball 40A may be different from the position in the vertical direction of the lower end portion of the solder ball 40B.

The five solder balls 40B are formed so as to cover the entire surface 30Ba of the electrode 30B.

As illustrated in FIG. 2, the coil conductor 50 is formed on inner surfaces 20C and 20D of the insulating layer 20. That is, in the first embodiment, the coil conductor 50 is provided inside the insulating layer 20. The ground conductor 80 is formed on an inner surface 20E of the insulating layer 20. The inner surface 20C is an upper surface of the first surface layer 21. The inner surface 20D is an upper surface of the intermediate layer 23. The inner surface 20E is an upper surface of the intermediate layer 24.

When the insulating layer 20 is made of ceramic, the coil conductor 50 and the ground conductor 80 are formed by co-firing a conductive paste printed on the insulating layer 20 with the insulating layer 20. In this case, the coil conductor 50 and the ground conductor 80 are made of, for example, copper. When the insulating layer 20 is made of resin, the coil conductor 50 and the ground conductor 80 are formed on the inner surfaces 20C, 20D, and 20E of the insulating layer 20 by known means such as etching. In this case, the coil conductor 50 and the ground conductor 80 are made of, for example, metal foil.

As illustrated in FIG. 1, in plan view of the wiring board 10 as viewed from the lower surface 20A side of the insulating layer 20, each of the coil conductors 50 formed on the inner surfaces 20C and 20D of the insulating layer 20 has a loop shape. Although not illustrated, the coil conductor 50 formed on the inner surface 20C of the insulating layer 20 and the coil conductor 50 formed on the inner surface 20D of the insulating layer 20 are electrically connected to each other by a known means such as a via conductor (not illustrated).

In the case of a resin board, a via conductor is formed by plating a conductive metal made of copper or the like in a through hole penetrating a layer (first surface layer 21, second surface layer 22, and intermediate layers 23 and 24) constituting the insulating layer 20, or in the case of a ceramic board, the via conductor is filled with a conductive paste and co-fired with a ceramic.

With the above configuration, in the first embodiment, the coil conductor 50 functions as a coil formed around a winding axis 50A extending along the lamination direction (vertical direction) of the insulating layer 20. The winding axis 50A of the coil conductor 50 is orthogonal to the lower surface 20A and the upper surface 20B of the insulating layer 20. Further, the winding axis 50A of the coil conductor 50 may cross the lower surface 20A and the upper surface 20B of the insulating layer 20. For example, the winding axis 50A of the coil conductor 50 may extend in a direction inclined with respect to the vertical direction.

The coil conductor 50 has an opening 50B. The opening 50B is a region inside the coil conductor 50 having a loop shape in plan view of the wiring board 10 as viewed from the lower surface 20A side of the insulating layer 20.

As illustrated in FIGS. 1 and 2, in plan view of the wiring board 10 as viewed from the lower surface 20A side of the insulating layer 20, the entire solder ball 40A is at a position overlapping the opening 50B of the coil conductor 50. On the other hand, in the plan view, the solder ball 40B is at a position deviated from the opening 50B of the coil conductor 50.

In addition, as illustrated in FIG. 1, in plan view of the wiring board 10 as viewed from the lower surface 20A side of the insulating layer 20, the area of the solder ball 40A is smaller than the area of the opening 50B of the coil conductor 50.

As illustrated in FIG. 2, in plan view of the wiring board 10 as viewed from the lower surface 20A side of the insulating layer 20, the coil conductor 50 is located inside the ground conductor 80. That is, in the plan view, the ground conductor 80 completely covers the opening 50B of the coil conductor 50 from above.

As a result, the ground conductor 80 can shield the magnetic flux formed when the current flows through the coil conductor 50. The ground conductor 80 is located above the coil conductor 50. Therefore, it is possible to reduce the influence of the magnetic flux on an object (for example, the electronic component 60) located above the coil conductor 50.

As illustrated in FIG. 2, the wiring board 10 includes two electronic components 61 and 62 as the electronic component 60. Each of the two electronic components 61 and 62 is various known components such as a resistor, a capacitor, a transistor, and an integrated circuit.

The two electronic components 61 and 62 are mounted on the upper surface 20B of the insulating layer 20. The electronic component 61 includes conductive portions 61A on both left and right ends. The electronic component 61 is electrically connected to the electrode 30D via the conductive portion 61A. Note that the electronic component 61 may include at least one conductive portion 61A.

The electronic component 62 includes solder balls 63 exposed to the outside. Similarly to the solder ball 40, the solder ball 63 is made of solder and has a substantially spherical shape. The electronic component 62 is electrically connected to the electrode 30D via the solder ball 63. The solder ball 63 is an example of a conductive portion.

A plurality of solder balls 63 are formed on a lower surface 62A of the electronic component 62. Although five solder balls 63 are illustrated in FIG. 2, the electronic component 62 may include at least one solder ball 63. In the first embodiment, the solder ball 63 is smaller than the solder ball 40, but the solder ball 63 may be larger than or equal to the solder ball 40. Each of the solder balls 63 is electrically connected to the electrode 30D.

In the first embodiment, the electronic components 61 and 62 and the solder ball 63 are at positions deviated from the opening 50B of the coil conductor 50 in plan view of the wiring board 10 as viewed from above, in other words, in plan view of the wiring board 10 as viewed from the upper surface 20B side of the insulating layer 20.

As illustrated in FIG. 2, the wiring board 10 includes a sealing resin 70. The sealing resin 70 is made of a resin such as an epoxy resin. The wiring board 10 includes sealing resins 71 and 72 as the sealing resin 70. The sealing resin 71 is an example of a first sealing resin. The sealing resin 72 is an example of a second sealing resin. Further, in FIG. 1 and FIGS. 3, 6, 7, 9, and 10 described later, the sealing resin 71 is not illustrated.

As illustrated in FIG. 2, the sealing resin 71 is provided on the lower surface 20A of the insulating layer 20 and the surface 90A of the stepped portion 90. The sealing resin 71 covers the electrodes 30A and 30B. In addition, the sealing resin 71 covers a part of the solder ball 40. More specifically, the lower end portion of the solder ball 40 is not covered with the sealing resin 71 and is located below the sealing resin 71. On the other hand, a portion other than the lower end portion of the solder ball 40 is covered with the sealing resin 71.

The sealing resin 72 is provided on the upper surface 20B of the insulating layer 20. The sealing resin 72 covers the electrode 30D and the electronic component 60. Note that the sealing resin 72 may cover only a part of the electronic component 60. For example, the upper surface of the electronic component 60 may be exposed to the outside without being covered with the sealing resin 72.

The variation in size of the solder ball 40 formed on the surface of each land electrode 30 can affect the magnetic flux formed by the coil conductor 50. The smaller the solder ball 40, the smaller the variation in size of the solder ball 40.

According to the first embodiment, in plan view of the wiring board 10 as viewed from the lower surface 20A side of the insulating layer 20, the solder ball 40A is at a position overlapping the opening 50B of the coil conductor 50. Therefore, the variation in size of the solder ball 40A can greatly affect the magnetic flux formed by the coil conductor 50. On the other hand, in the plan view, the solder ball 40B is at a position deviated from the opening 50B of the coil conductor 50. Therefore, the solder ball 40B does not greatly affect the magnetic flux formed by the coil conductor 50.

According to the first embodiment, in plan view of the wiring board 10 as viewed from the lower surface 20A side of the insulating layer 20, the area of the solder balls 40A is smaller than the area of the solder balls 40B. As a result, when there is a variation in size of the solder ball 40, the variation in size of the solder ball 40A can be made smaller than the variation in size of the solder ball 40B. Therefore, it is possible to reduce the influence of the variation in size of the solder ball 40 on the magnetic flux formed by the coil conductor 50.

In addition, according to the first embodiment, in plan view of the wiring board 10 as viewed from the lower surface 20A side of the insulating layer 20, the influence of the solder ball 40A on the magnetic flux formed by the coil conductor 50 can be reduced as compared with the case where the area of the solder ball 40A is larger than the area of the solder ball 40B. Therefore, the performance of the coil conductor 50 and the wiring board 10 can be improved.

According to the first embodiment, in plan view of the wiring board 10 as viewed from the lower surface 20A side of the insulating layer 20, the influence of the solder ball 40A on the magnetic flux formed by the coil conductor 50 can be reduced as compared with the case where the area of the solder ball 40A is larger than the area of the opening 50B of the coil conductor 50. Therefore, the performance of the coil conductor 50 and the wiring board 10 can be improved.

The solder ball 40 located behind the land electrode 30 as viewed from the coil conductor 50 has a small influence on the magnetic flux formed by the coil conductor 50. On the other hand, the solder ball 40 not located behind the land electrode 30 but located outside the land electrode 30 as viewed from the coil conductor 50 has a large influence on the magnetic flux formed by the coil conductor 50.

According to the first embodiment, when viewed from the coil conductor 50, a part of the solder ball 40A is located outside the electrode 30A to which the solder ball 40A is connected. Therefore, the influence of the variation in size of the solder ball 40A on the magnetic flux formed by the coil conductor 50 increases.

However, in the first embodiment, since the area of the solder ball 40A is smaller than the area of the solder ball 40B in plan view of the wiring board 10 as viewed from the lower surface 20A side of the insulating layer 20, the influence of the variation in size of the solder ball 40A on the magnetic flux formed by the coil conductor 50 can be reduced. Therefore, it is possible to reduce the influence of the variation in size of the solder ball 40 on the magnetic flux formed by the coil conductor 50.

In order to make the area of the solder balls 40A smaller than the area of the solder balls 40B in plan view of the wiring board 10 as viewed from the lower surface 20A side of the insulating layer 20, it is conceivable to reduce the amount of the material for forming the solder balls 40A to be smaller than the amount of the material for forming the solder balls 40B. At this time, the thickness of the solder ball 40A may become smaller than the thickness of the solder ball 40B. In such a case, a difference in position in a direction orthogonal to the lower surface 20A of the insulating layer 20 occurs between a portion farthest from the lower surface 20A of the solder ball 40A and a portion farthest from the lower surface 20A of the solder ball 40B.

The wiring board 10 is used by being mounted on another board, for example, a mother board. At this time, in the wiring board 10 having the above-described difference in position, the possibility of occurrence of a mounting failure increases.

According to the first embodiment, the distance between the surface 30Aa of the electrode 30A to which the solder ball 40A is connected and the lower surface 20A is longer than the distance between the surface 30Ba of the electrode 30B to which the solder ball 40B is connected and the lower surface 20A. Therefore, even when the thickness of the solder ball 40A is smaller than the thickness of the solder ball 40B, the position of the portion of the solder ball 40A farthest from the lower surface 20A can be aligned with the position of the portion of the solder ball 40B farthest from the lower surface 20A in the direction orthogonal to the lower surface 20A of the insulating layer 20. Therefore, the possibility of occurrence of mounting failure can be reduced.

According to the first embodiment, the solder ball 40 can be stably fixed to the land electrode 30 by the sealing resin 71.

According to the first embodiment, the electronic component 60 can be stably fixed to the insulating layer 20 by the sealing resin 72.

According to the first embodiment, in plan view of the wiring board 10 as viewed from the upper surface 20B side of the insulating layer 20, the electronic component 60 is at a position deviated from the opening 50B of the coil conductor 50. Therefore, the influence of the magnetic flux formed by the coil conductor 50 on the electronic component 60 can be reduced.

Figure 3:
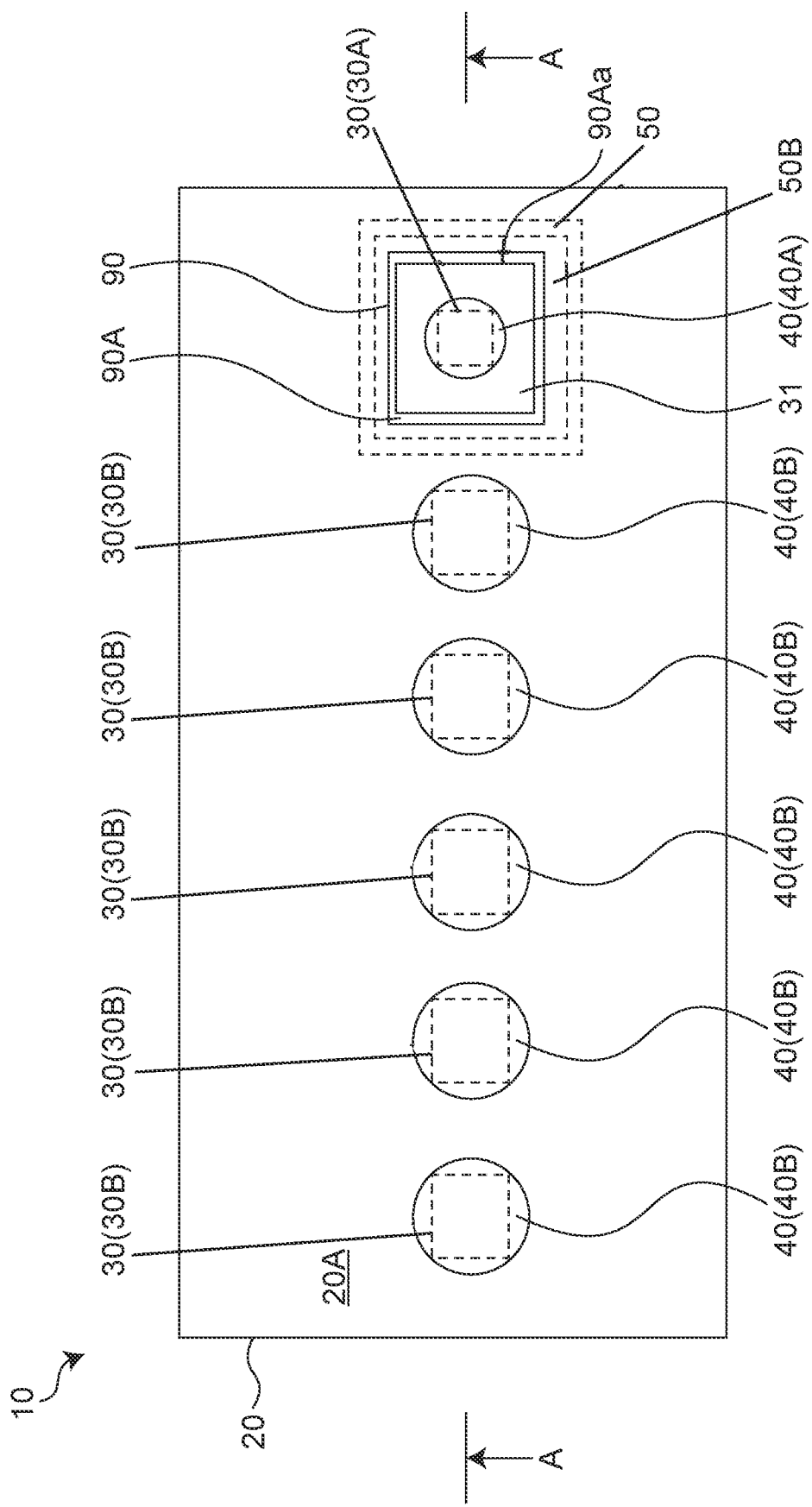
FIG. 3 is a bottom view of a modification of the wiring board according to the first embodiment of the present disclosure.
Figure 4:
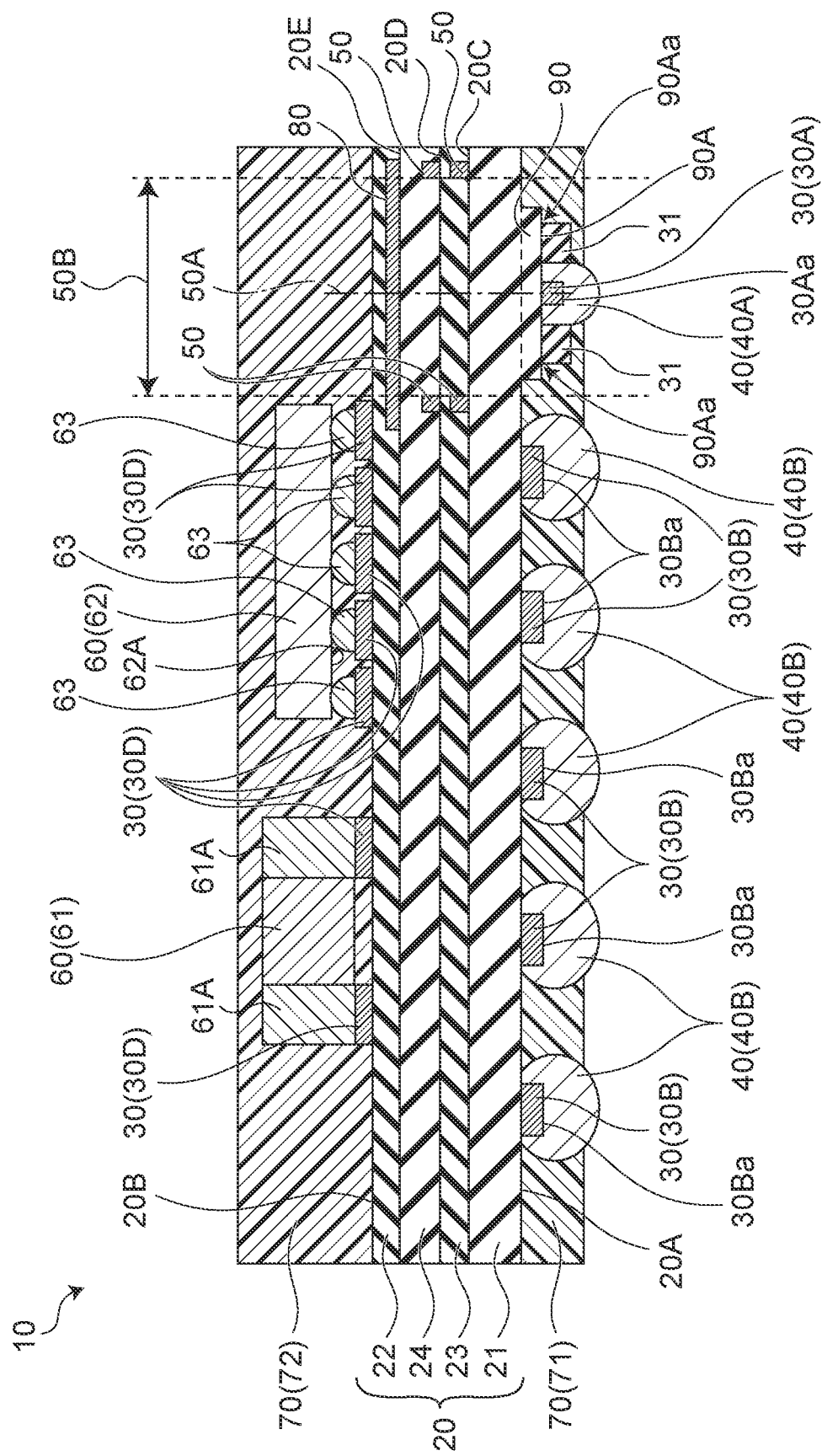
FIG. 4 is a cross-sectional view of a modification of the wiring board according to the first embodiment of the present disclosure.

FIG. 3 is a bottom view of a modification of the wiring board according to the first embodiment of the present disclosure. FIG. 4 is a cross-sectional view of a modification of the wiring board according to the first embodiment of the present disclosure. As illustrated in FIGS. 3 and 4, an insulating resist film 31 is formed on the surface 90A of the stepped portion 90. The resist film 31 is an example of the covering portion.

As illustrated in FIG. 3, the resist film 31 is formed so as to surround the electrode 30A in plan view of the wiring board 10 as viewed from the lower surface 20A side of the insulating layer 20. Specifically, the resist film 31 covers a peripheral portion 90Aa of the electrode 30A on the surface 90A of the stepped portion 90. The peripheral portion 90Aa is a peripheral portion outside the side of the square constituting the electrode 30A.

Furthermore, the resist film 31 may cover at least a part of the surface 30Aa of the electrode 30A.

According to the above modification of the first embodiment, wet-spreading of solder forming the solder ball 40A is reduced by the resist film 31. Therefore, it is possible to suppress the area of the solder balls 40A from becoming larger than the area of the solder balls 40B in plan view of the wiring board 10 as viewed from the lower surface 20A side of the insulating layer 20.

Hereinafter, an example of a method for manufacturing the wiring board 10 will be described.

The wiring board 10 is divided by cutting a stacked body. The stacked body is formed by integrating a plurality of wiring boards 10 in an arranged state. In the following description, a method of manufacturing one wiring board 10 constituting the stacked body will be described. In addition, in the following description, it is assumed that the insulating layer 20 of the wiring board 10 is made of ceramic.

First, a sheet forming step is performed. In the sheet forming step, sheets corresponding to the four layers (first surface layer 21, second surface layer 22, and intermediate layers 23 and 24) constituting the insulating layer 20 and the stepped portion 90 are formed as described in detail below. A slurry is made by mixing the ceramic powder, binder, and plasticizer in any amount. The slurry is applied onto the carrier film to form a sheet. The slurry is applied using a lip coater, a doctor blade, and the like. As the carrier film, for example, a PET (polyethylene terephthalate) film or the like is used. The thickness of each sheet is, for example, such that the thickness after firing is 1 to 150 μm.

Next, a via conductor forming step is performed. In the via conductor forming step, the via conductors are formed as described in detail below. Any number of through holes are formed in each sheet. Of course, when the sheet does not need a through hole, the through hole is not formed in the sheet. Each through hole is formed by, for example, a mechanical punch, a UV laser, a $CO_2$ laser, or the like. Each through hole is filled with a conductive paste. As a result, the via conductor is formed. The conductive paste is prepared, for example, by mixing raw materials containing conductive powders, a plasticizer, and a binder. For example, a eutectic material such as ceramic powders mixed in each sheet may be added to the conductive paste in order to adjust the shrinkage rate during firing. The via conductor can constitute a part of the coil conductor 50 as described above. Note that, in each drawing, illustration of via conductors is omitted.

Next, an electrode forming step is performed. In the electrode forming step, the land electrode 30 (electrode 30A) is formed on a sheet corresponding to the stepped portion 90 among the five sheets. In addition, the land electrode 30 (electrode 30B) is formed on a sheet corresponding to the first surface layer 21 among the five sheets. In addition, the land electrode 30 (electrode 30D) is formed on a sheet corresponding to the second surface layer 22 among the five sheets. In addition, the coil conductor 50 is formed on a sheet corresponding to the first surface layer 21 and the intermediate layer 23 among the five sheets. In addition, the ground conductor 80 is formed on a sheet corresponding to the intermediate layer 24 among the five sheets. In plan view of the wiring board 10 as viewed from the lower surface 20A of the insulating layer 20, a length of one side of the land electrode 30 is, for example, 30 μm or more.

The land electrode 30, the coil conductor 50, and the ground conductor 80 are formed by, for example, printing a conductive paste. Examples of the printing include screen printing, inkjet printing, and gravure printing. Wiring such as a signal line and a power line may be formed on each sheet similarly to the coil conductor 50 and the ground conductor 80.

Although the material of the conductive paste constituting the via conductor, the coil conductor 50, and the ground conductor 80 described above is arbitrary, the conductive paste for forming the coil conductor 50 and the via conductor constituting a part of the coil conductor 50 is preferably a pure copper-based paste.

Next, a resist film forming step is executed. In the resist film forming step, the resist film 31 is formed on a sheet corresponding to the stepped portion 90 among the five sheets. The resist film 31 is formed so as to cover the peripheral portion 90Aa of the electrode 30A on the surface 90A of the stepped portion 90. The resist film 31 is printed on a sheet in the same manner as the conductive paste described above.

Next, a lamination step is performed. In the laminating step, the respective sheets from which the carrier film has been removed are laminated, and subjected to pressure bonding and firing in a mold. After firing, each of the laminated sheets is plated. The plating is, for example, Ni—Sn plating or Ni-electroless Au plating. As a result, the insulating layer 20 is obtained.

Next, a mounting step is performed. In the mounting step, the electronic component 60 (electronic components 61 and 62) is mounted on the upper surface 20B of insulating layer 20. The implementation is performed by known means. After implementation, a reflow process is performed. The insulating layer 20 may be cleaned with an organic cleaning liquid or the like after the reflow treatment.

Next, a solder ball forming step is performed. In the solder ball forming step, the solder balls 40 are formed on the front surface 90A of the stepped portion 90 and the lower surface 20A of the insulating layer 20. The solder ball 40 is formed by a known means. As in the case of mounting the electronic component 60, reflow processing and cleaning may be executed after the formation of the solder ball 40.

Next, a coating step is performed. In the coating step, the sealing resin 70 is coated on the insulating layer 20 and the stepped portion 90. Specifically, the sealing resin 71 is coated on the lower surface 20A of the insulating layer 20 and the surface 90A of the stepped portion 90, and the sealing resin 72 is coated on the upper surface 20B of the insulating layer 20. As a result, the sealing resin 71 covers the electrodes 30A and 30B, the resist film 31, and a portion other than the lower end portion of the solder ball 40. In addition, the sealing resin 72 covers the electrode 30D and the electronic component 60.

Next, a dicing step is performed. In the dicing step, the above-described dicing is executed. Thus, a plurality of wiring boards 10 are prepared.

In the first embodiment, the insulating layer 20 includes four layers as illustrated in FIG. 2, but may include layers other than the four layers. The insulating layer 20 may include at least one layer.

The thicknesses of the respective layers (first surface layer 21, second surface layer 22, and intermediate layers 23 and 24) of the insulating layer 20 may be different from each other, or the thicknesses of at least two insulating layers 20 may be the same.

The number of land electrodes 30 is not limited to 13. The wiring board 10 may include the plurality of land electrodes 30. The number of electrodes 30A is not limited to 1. The number of the electrodes 30B is not limited to 5. The number of the electrodes 30D is not limited to 7. The wiring board 10 may include at least one land electrode 30. The wiring board 10 may not include the electrode 30D.

The number of the solder balls 40 is not limited to 6. The wiring board 10 may include a plurality of solder balls 40. The number of solder balls 40A is not limited to one. The number of the solder balls 40B is not limited to 5. The wiring board 10 may include at least one of the solder balls 40A and 40B.

In the first embodiment, in plan view of the wiring board 10 as viewed from the lower surface 20A side of the insulating layer 20, the entire solder ball 40A is at a position overlapping the opening 50B of the coil conductor 50, but the present disclosure is not limited thereto. In the plan view, only a part of the solder ball 40A may be at a position overlapping the opening 50B of the coil conductor 50.

In the modification of the first embodiment, the resist film 31 corresponds to the covering portion. However, the covering portion is not limited to the resist film 31 as long as it has insulating properties. For example, the covering portion may be a glass film. In addition, the covering portion may also be formed on the electrodes 30B and 30D and an electrode 30C to be described later in the same manner as the electrode 30A.

In the first embodiment and each embodiment described later, the solder ball 40 corresponds to a conductive member. However, the conductive member only needs to have conductivity, and is not limited to the solder ball 40. For example, the conductive member may be a resin-based conductive adhesive in which a conductive filler is mixed. Examples of the resin include epoxy resins, silicone resins, acrylic resins, and urethane resins. In addition, examples of the conductive material contained in the resin include Ag, Cu, Ni, Al, and Au. Similarly, in the first embodiment and each embodiment described later, the solder ball 63 corresponds to a conductive portion, but the conductive portion is not limited to the solder ball 63 as long as it has conductivity.

In the first embodiment, the electrode 30A is formed on the surface 90A of the stepped portion 90. However, the electrode 30A may be formed at a position overlapping the lower surface 20A in plan view seen from the lower surface 20A side of the insulating layer 20. For example, when the insulating layer 20 does not have the stepped portion 90, the electrode 30A may be formed on the lower surface 20A of the insulating layer 20.

In the first embodiment, in plan view of the wiring board 10 as viewed from the lower surface 20A side of the insulating layer 20, the area of the solder ball 40A is smaller than the area of the opening 50B of the coil conductor 50. However, the area of the solder ball 40A may be equal to or larger than the area of the opening 50B of the coil conductor 50.

In the first embodiment, in plan view of the wiring board 10 as viewed from the lower surface 20A side of the insulating layer 20, the area of the solder ball 40A is larger than the area of the electrode 30A. However, the area of the solder ball 40A may be equal to or smaller than the area of the electrode 30A.

In the first embodiment, in plan view of the wiring board 10 as viewed from the lower surface 20A side of the insulating layer 20, the entire portion of the electrode 30A overlaps the solder ball 40A. However, only a part of the electrode 30A may overlap the solder ball 40A.

In the first embodiment, the five solder balls 40B have the same size, but the five solder balls 40B may have different sizes. In the first embodiment, the plurality of solder balls 63 have the same size, but the plurality of solder balls 63 may have different sizes.

In the first embodiment, as illustrated in FIG. 2, one solder ball 40 is electrically connected to one electrode 30A or one electrode 30B, and one solder ball 63 is electrically connected to one electrode 30D. However, the plurality of solder balls 40 may be electrically connected to one electrode 30A or one electrode 30B. Similarly, a plurality of solder balls 63 may be electrically connected to one electrode 30D.

In the first embodiment, as illustrated in FIG. 2, the electrode 30A is formed on the surface 90A of the stepped portion 90. As a result, the distance between the surface 30Aa of the electrode 30A and the lower surface 20A is longer than the distance between the surface 30Ba of the electrode 30B and the lower surface 20A. However, a measure for making the distance between the surface 30Aa and the lower surface 20A longer than the distance between the surface 30Ba and the lower surface 20A is not limited thereto.

Figure 5:
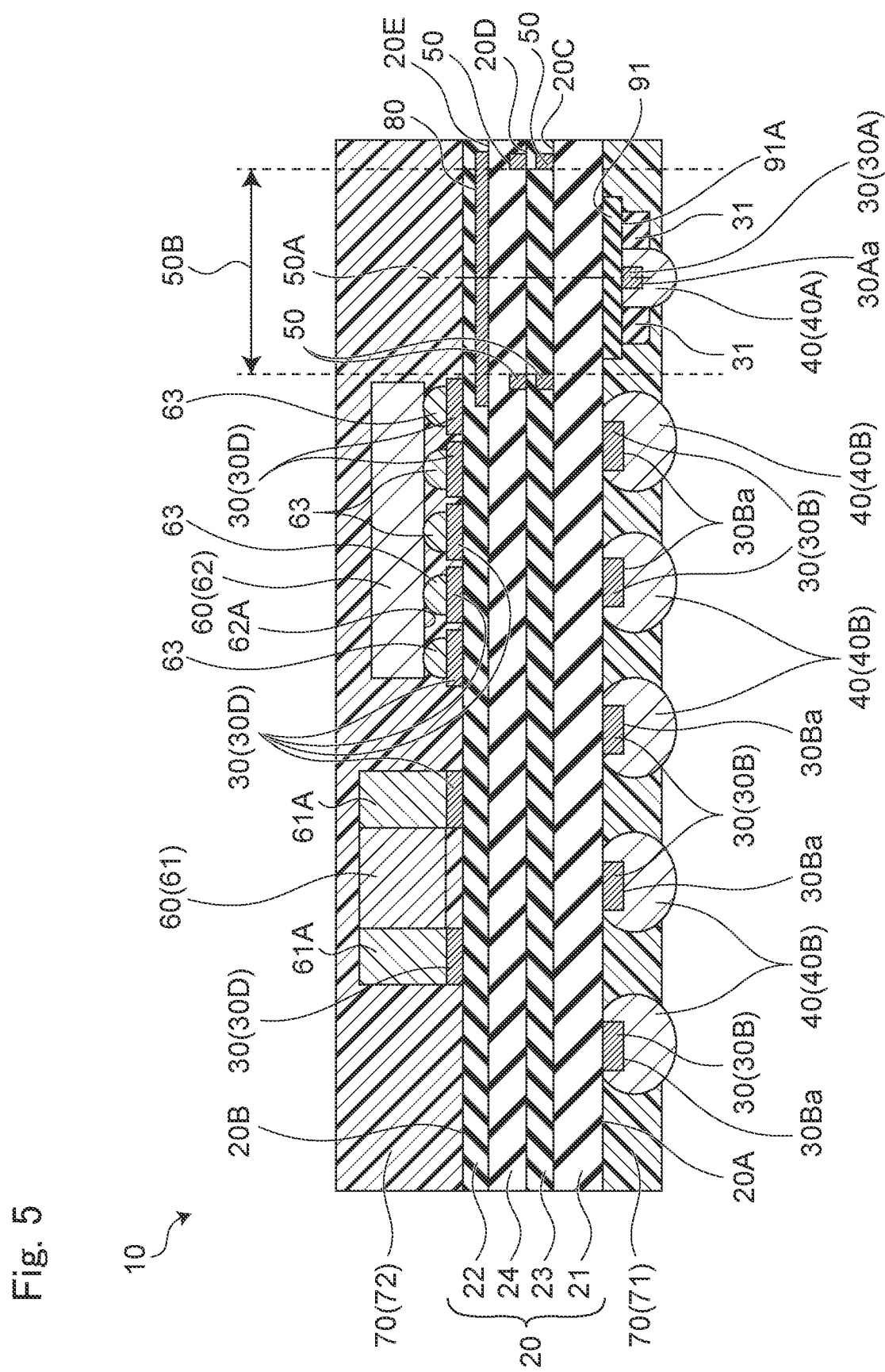
FIG. 5 is a cross-sectional view of a modification of the wiring board according to the first embodiment of the present disclosure.

FIG. 5 is a cross-sectional view of a modification of the wiring board according to the first embodiment of the present disclosure. As illustrated in FIG. 5, a spacer 91 is provided on the lower surface 20A of the insulating layer 20 instead of the stepped portion 90. In this case, the electrode 30A is formed on a surface 91A which is a surface on a side of the spacer 91 opposite to the first surface layer 21. The spacer 91 may be made of the same material as the material forming the insulating layer 20, or may be made of a different material, for example, a metal such as copper.

In addition, as another measure, the electrode 30B and the electrode 30A having a thickness in the vertical direction larger than that of the electrode 30B may be formed on the lower surface 20A of the insulating layer 20.

Figure 6:
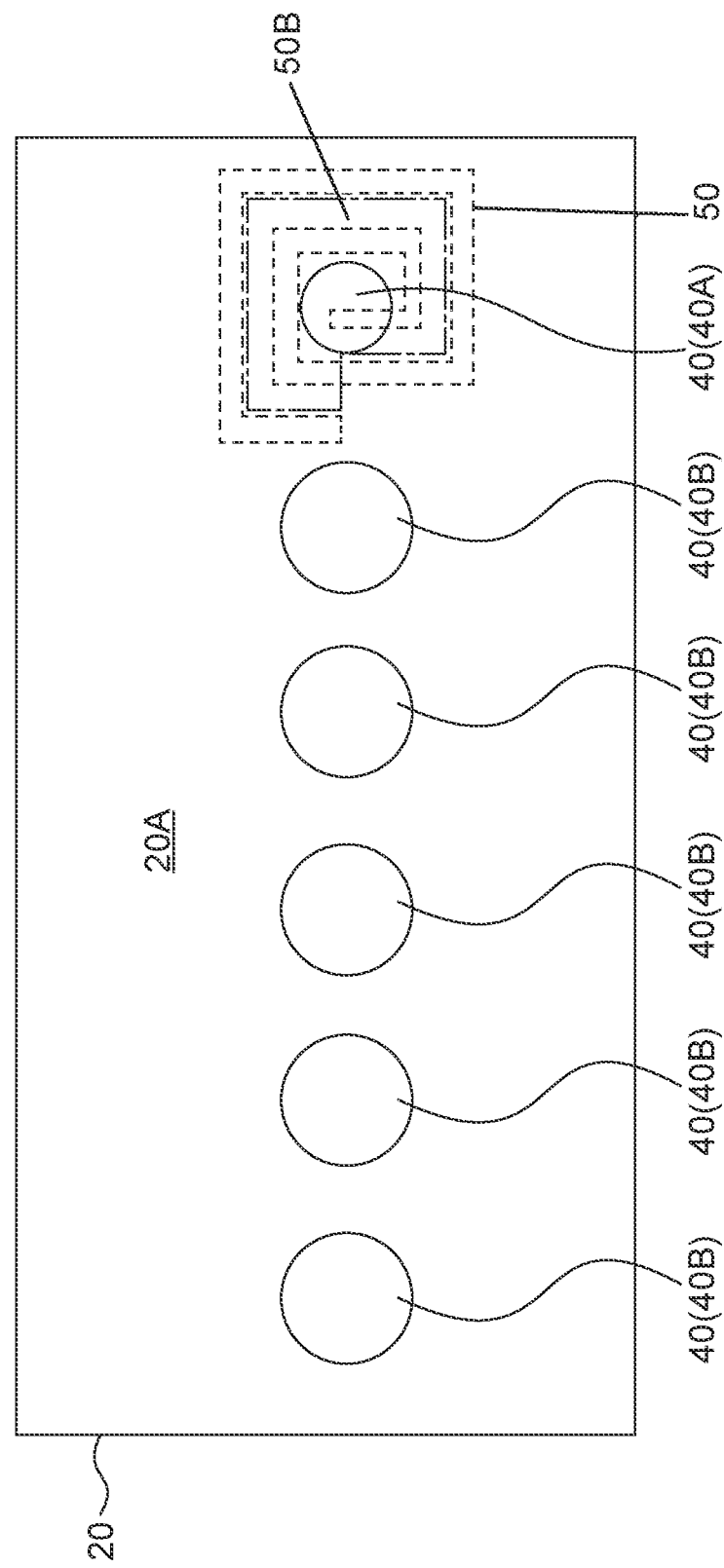
FIG. 6 is a bottom view of a modification of the wiring board according to the first embodiment of the present disclosure.

In the first embodiment, as illustrated in FIG. 1, the coil conductor 50 has a loop shape in plan view of the wiring board 10 as viewed from the lower surface 20A side of the insulating layer 20, but is not limited to the loop shape. FIG. 6 is a bottom view of a modification of the wiring board according to the first embodiment of the present disclosure. As illustrated in FIG. 6, the coil conductor 50 may have a spiral shape in the plan view. In this case, a region inside the outermost peripheral coil conductor 50 is the opening 50B of the coil conductor 50. That is, a region surrounded by an alternate long and short dash line in FIG. 6 is the opening 50B of the coil conductor 50.

In the first embodiment, as illustrated in FIG. 2, in plan view of the wiring board 10 as viewed from the lower surface 20A side of the insulating layer 20, the ground conductor 80 completely covers the opening 50B of the coil conductor 50 from above, but the ground conductor 80 may cover only a part of the opening 50B of the coil conductor 50 from above.

In the first embodiment, the ground conductor 80 is formed above the coil conductor 50 (on the upper surface 20B side of the insulating layer 20 with respect to the coil conductor 50), but may be formed below the coil conductor 50 (on the lower surface 20A side of the insulating layer 20 with respect to the coil conductor 50). In addition, the ground conductor 80 may be formed both above and below the coil conductor 50. In addition, the wiring board 10 may not include the ground conductor 80.

In the first embodiment, as illustrated in FIG. 2, two electronic components 60 (electronic components 61 and 62) are mounted on the upper surface 20B of the insulating layer 20. However, the number and positions of the electronic components 60 mounted on the wiring board 10 are not limited to the number and positions illustrated in FIG. 2. For example, one or three or more electronic components 60 may be mounted on the upper surface 20B of the insulating layer 20. In addition, for example, the electronic component 60 may be mounted on the lower surface 20A of the insulating layer 20, or may be mounted on both the upper surface 20B and the lower surface 20A of the insulating layer 20.

Second Embodiment

Figure 7:
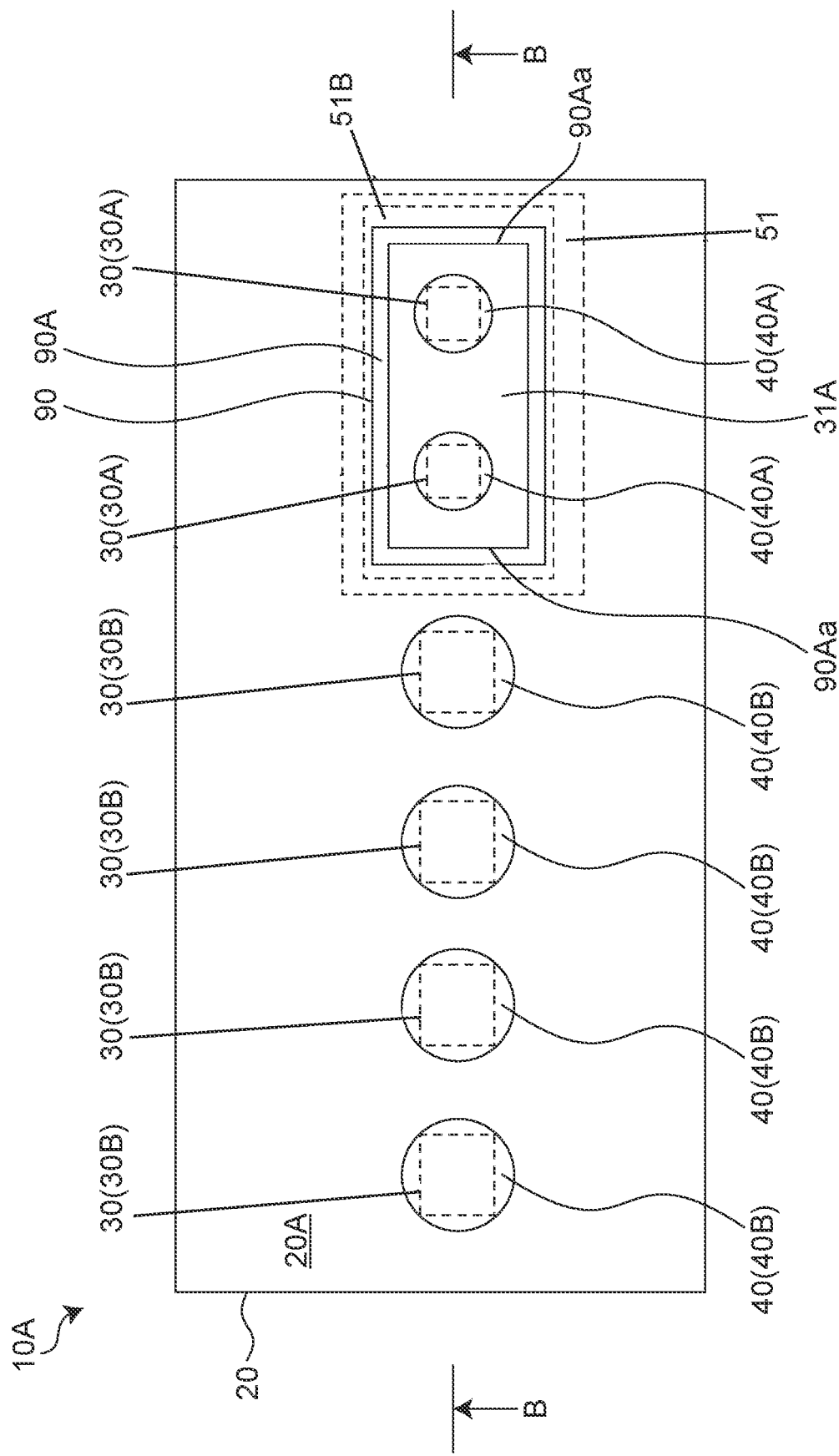
FIG. 7 is a bottom view of a wiring board according to a second embodiment of the present disclosure.
Figure 8:
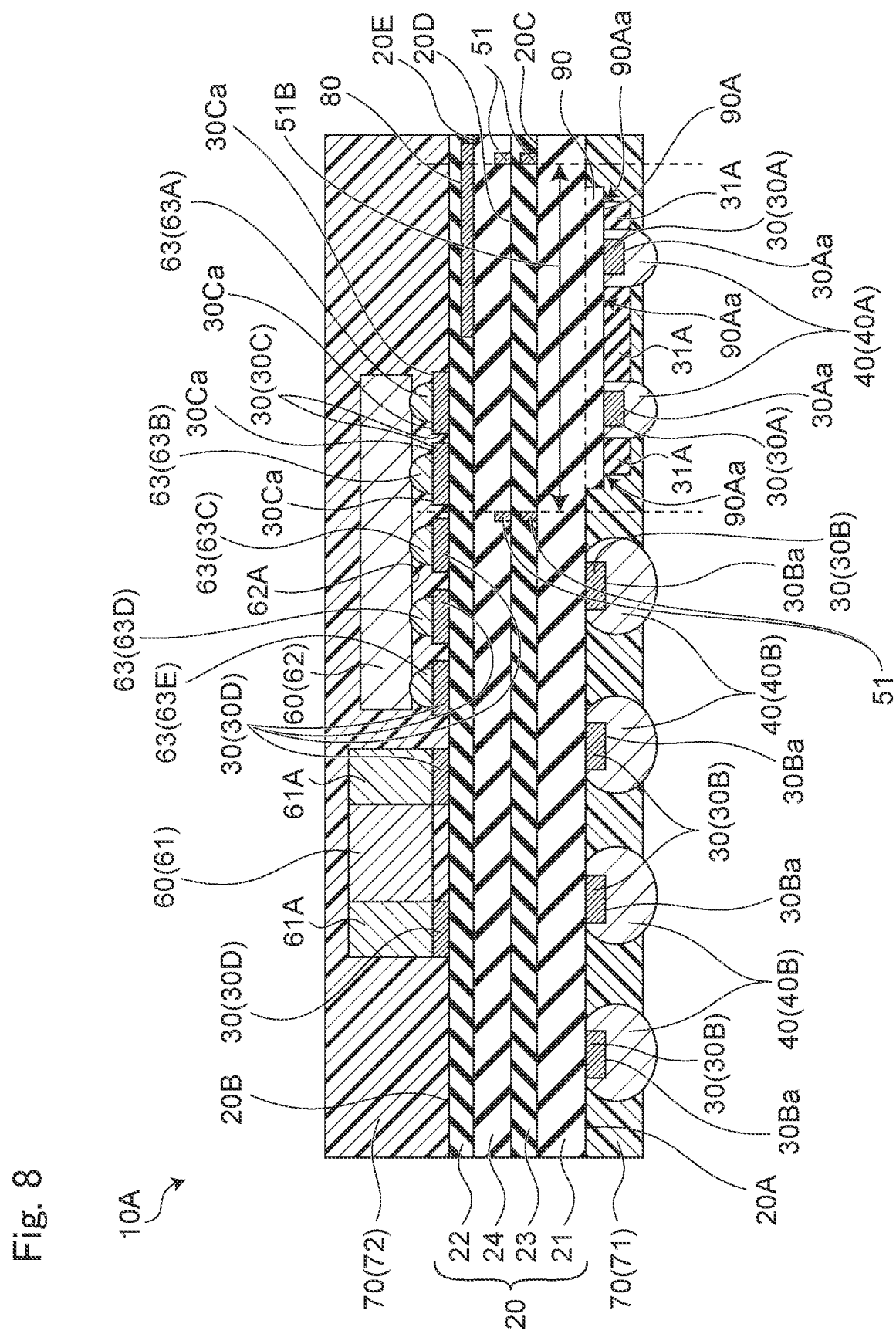
FIG. 8 is a cross-sectional view illustrating a cross section taken along line B-B in FIG. 7.

FIG. 7 is a bottom view of a wiring board according to a second embodiment of the present disclosure. FIG. 8 is a cross-sectional view illustrating a cross section taken along line B-B in FIG. 7. A wiring board 10A according to the second embodiment is different from the wiring board 10 according to the first embodiment in that a plurality of solder balls 40A overlap a coil conductor 51 in plan view of the wiring board 10A as viewed from the lower surface 20A side of the insulating layer 20. The wiring board 10A according to the second embodiment is different from the wiring board 10 according to the first embodiment in that the electronic component 62 overlaps the coil conductor 51 in plan view of the wiring board 10A as viewed from the upper surface 20B side of the insulating layer 20.

As illustrated in FIGS. 7 and 8, the wiring board 10A includes two electrodes 30A, four electrodes 30B, two electrodes 30C, and five electrodes 30D.

As in the first embodiment, in plan view of the wiring board 10A as viewed from the lower surface 20A side of the insulating layer 20, the area of the electrode 30A is smaller than the area of the electrode 30B. In addition, in plan view of the wiring board 10A as viewed from the upper surface 20B side of the insulating layer 20, the area of the electrode 30C is larger than the area of the electrode 30D.

As illustrated in FIG. 7, in plan view of the wiring board 10A as viewed from the lower surface 20A side of the insulating layer 20, one insulating resist film 31A is formed so as to surround each of the two electrodes 30A.

As illustrated in FIGS. 7 and 8, the six solder balls 40 include two solder balls 40A and four solder balls 40B. The solder ball 40A is formed on the front surface 30Aa of the electrode 30A. The solder ball 40B is formed on the front surface 30Ba of the electrode 30B.

The coil conductor 51 is configured similarly to the coil conductor 50 (see FIGS. 1 and 2). However, the coil conductor 51 is larger than the coil conductor 50 in plan view of the wiring board 10A as viewed from the lower surface 20A side of the insulating layer 20.

The coil conductor 51 has an opening 51B. The opening 51B is a region inside the coil conductor 51 having a loop shape in plan view of the wiring board 10A as viewed from the lower surface 20A side of the insulating layer 20.

As illustrated in FIG. 7, in plan view of the wiring board 10A as viewed from the lower surface 20A side of the insulating layer 20, all of the two solder balls 40A are at positions overlapping the opening 51B of the coil conductor 51. On the other hand, in the plan view, the four solder balls 40B are at positions deviated from the opening 51B of the coil conductor 51. When the wiring board 10 includes three or more solder balls 40A, the number of solder balls 40A at positions overlapping the openings 51B in the plan view may be three or more.

In plan view of the wiring board 10A as viewed from the upper surface 20B side of the insulating layer 20, all of the two electrodes 30C are at positions overlapping the opening 51B of the coil conductor 51. On the other hand, in the plan view, the five electrodes 30D are at positions deviated from the opening 51B of the coil conductor 51. Note that when the wiring board 10 includes three or more electrodes 30C, the number of electrodes 30C at positions overlapping the opening 51B in the plan view may be three or more.

As illustrated in FIG. 8, in plan view of the wiring board 10A as viewed from the lower surface 20A side of the insulating layer 20, the ground conductor 80 covers only a part of the opening 51B of the coil conductor 51.

In the second embodiment, the electronic component 62 includes five solder balls 63. Among the five solder balls 63 included in the electronic component 62, two solder balls 63A and 63B are positioned to overlap the opening 51B of the coil conductor 51 in plan view of the wiring board 10A as viewed from the upper surface 20B side of the insulating layer 20. On the other hand, the remaining three solder balls 63C, 63D, and 63E among the five solder balls 63 included in the electronic component 62 are at positions deviated from the opening 51B of the coil conductor 51 in the plan view.

The solder balls 63A and 63B are electrically connected to the electrode 30C. The solder balls 63C, 63D, and 63E are electrically connected to the electrode 30D.

In plan view of the wiring board 10A as viewed from the upper surface 20B side of the insulating layer 20, the solder balls 63A and 63B are located inside an outer edge portion 30Ca of the electrode 30C. The outer edge portion 30Ca is a side of a square constituting the electrode 30C and a peripheral portion inside the side of the square in the plan view. That is, in the plan view, the area of each of the solder balls 63A and 63B connected to the electrode 30C is smaller than the area of the electrode 30C. In addition, in the plan view, the entire portions of the solder balls 63A and 63B formed in the electrode 30C overlap the electrode 30C.

Note that, in plan view of the wiring board 10A as viewed from the upper surface 20B side of the insulating layer 20, the area of each of the solder balls 63A and 63B may be equal to or larger than the area of the electrode 30C. In addition, in the plan view, only a part of the solder balls 63A and 63B may overlap the electrode 30C.

A part of the electronic component 62 overlaps the opening 51B of the coil conductor 51 in plan view of the wiring board 10A as viewed from the upper surface 20B side of the insulating layer 20. The electronic component 62 is an example of the overlapping component. Further, all of the electronic components 62 may overlap the opening 51B of the coil conductor 51 in the plan view.

The conductive portions 61A provided at the left and right ends of the electronic component 61 are electrically connected to the electrode 30D. The electronic component 61 is at a position deviated from the opening 51B of the coil conductor 51 in plan view of the wiring board 10A as viewed from the upper surface 20B side of the insulating layer 20. The electronic component 61 is an example of a non-overlapping component.

According to the second embodiment, when there is a variation in size of the two solder balls 40A, it is possible to reduce the influence of the variation on the magnetic flux formed by the coil conductor 51. In addition, since the influence of the solder ball 40A on the magnetic flux formed by the coil conductor 51 is reduced, the performance of the coil conductor 51 and the wiring board 10A can be improved.

In the second embodiment, as illustrated in FIG. 7, in plan view of the wiring board 10A as viewed from the lower surface 20A side of the insulating layer 20, all of the two solder balls 40A are at positions overlapping the opening 51B of the coil conductor 51. However, as described in detail below, in the plan view, only a part of the solder ball 40A may be at a position overlapping the opening 51B of the coil conductor 51.

In the second embodiment, the ground conductor 80 covers only a part of the opening 51B of the coil conductor 51, but may cover the entire opening 51B.

Figure 9:
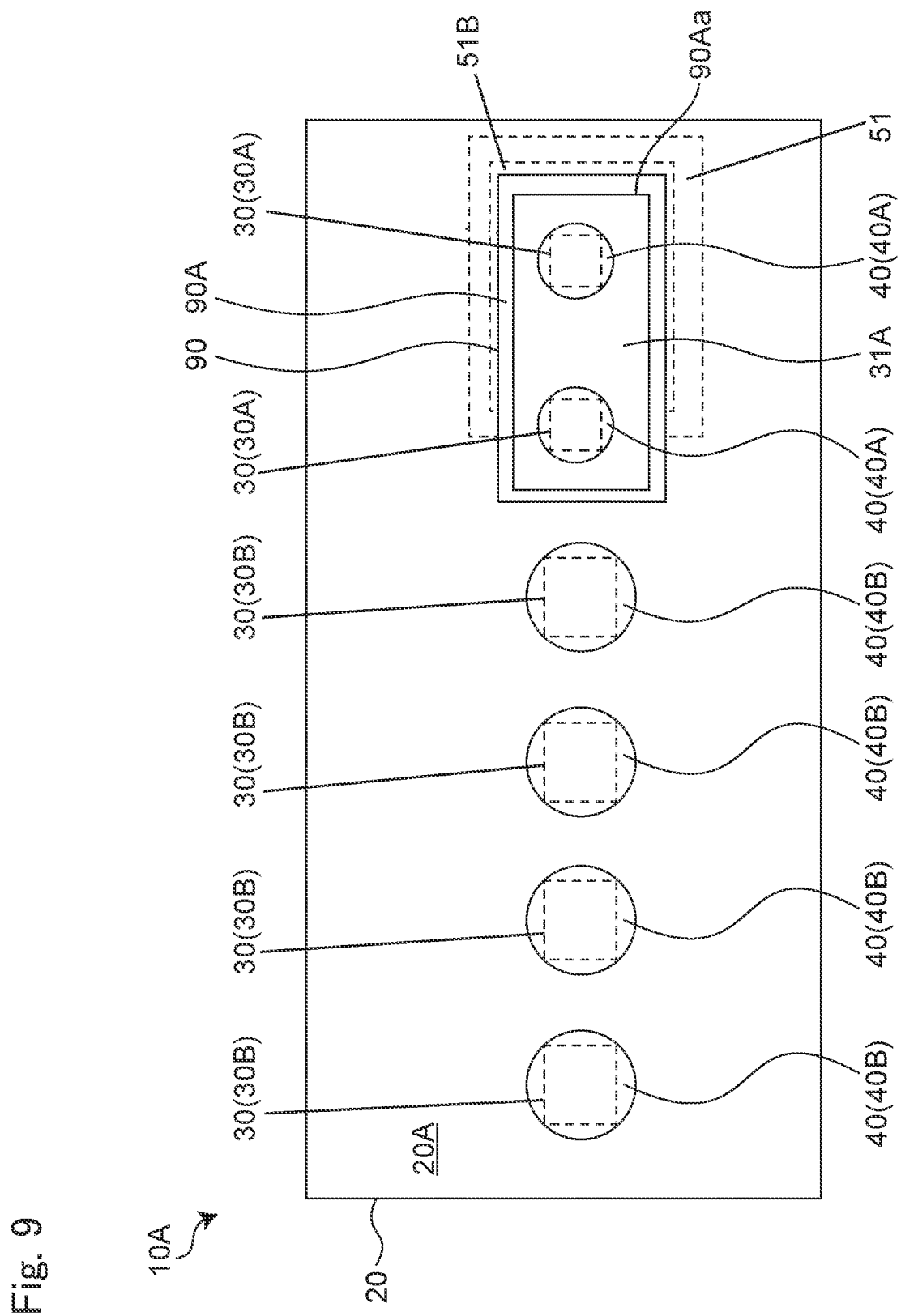
FIG. 9 is a bottom view of a modification of the wiring board according to the second embodiment of the present disclosure.

FIG. 9 is a bottom view of a modification of the wiring board according to the second embodiment of the present disclosure. For example, as illustrated in FIG. 9, in plan view of the wiring board 10A as viewed from the lower surface 20A side of the insulating layer 20, while the entire one solder ball 40A of the two solder balls 40A may be at a position overlapping the opening 51B of the coil conductor 51, only a part of the other solder ball 40A of the two solder balls 40A may be at a position overlapping the opening 51B of the coil conductor 51. Of course, in the plan view, only a part of each of the two solder balls 40A may be at a position overlapping the opening 51B of the coil conductor 51. In addition, similarly to the solder ball 40A, in plan view of the wiring board 10A as viewed from the upper surface 20B side of the insulating layer 20, only a part of the electrode 30C may be at a position overlapping the opening 51B of the coil conductor 51.

In the second embodiment, as illustrated in FIG. 7, in plan view of the wiring board 10A as viewed from the lower surface 20A side of the insulating layer 20, one resist film 31A surrounds each of the two electrodes 30A, and the solder ball 40 is formed on each of the two electrodes 30A. However, in a case where the plurality of solder balls 40 are electrically connected to the same electrode 30A, a configuration as illustrated in FIG. 10 may be adopted as described in detail below.

Figure 10:
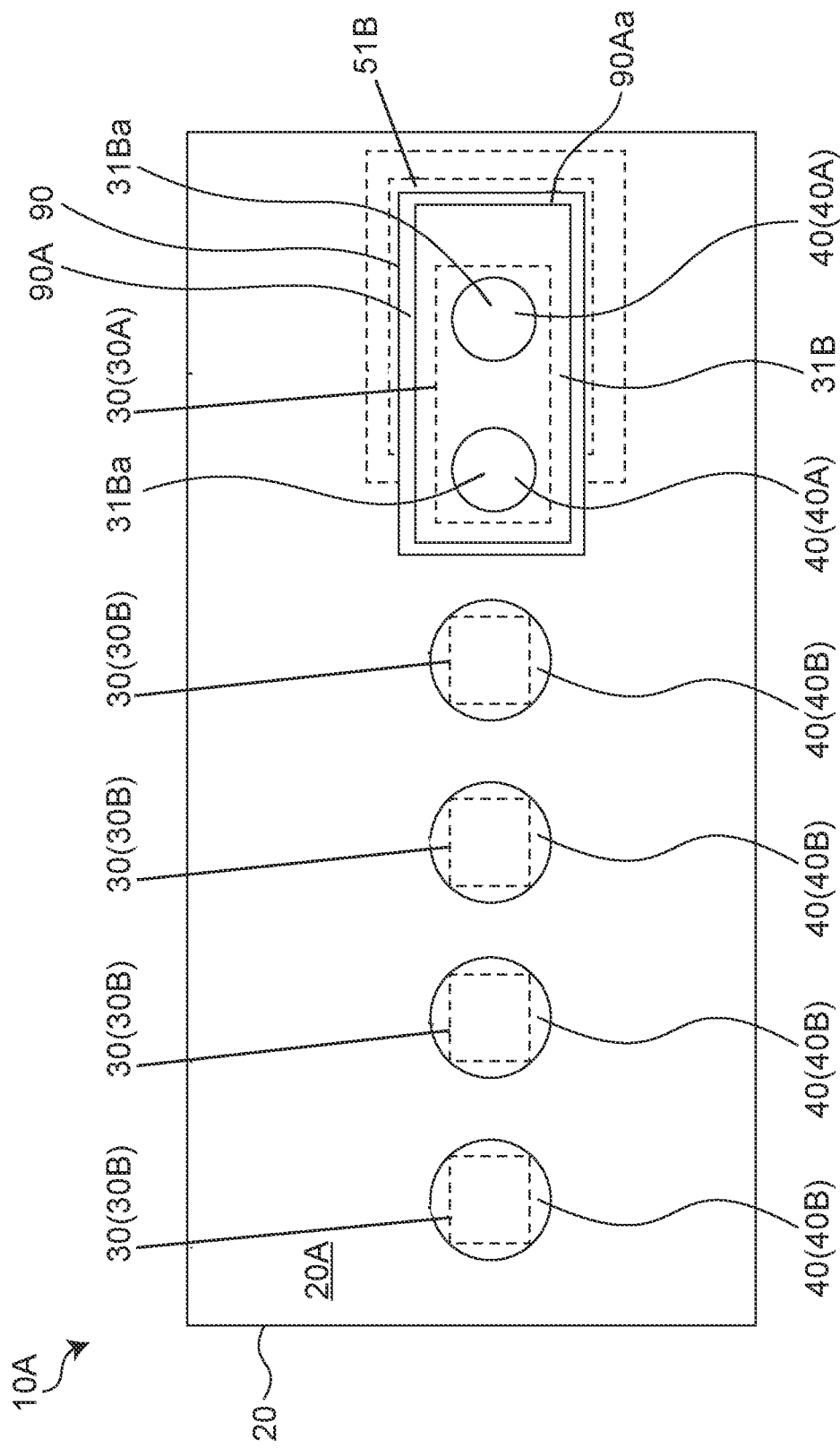
FIG. 10 is a bottom view of a modification of the wiring board according to the second embodiment of the present disclosure.

FIG. 10 is a bottom view of a modification of the wiring board according to the second embodiment of the present disclosure. As illustrated in FIG. 10, one resist film 31B covering one electrode 30A may have a plurality of (two in FIG. 10) openings 31Ba. In this case, the solder ball 40 is formed in each of the two openings 31Ba. As a result, the two solder balls 40 are electrically connected to the same electrode 30A. Note that, when the other electrodes 30B, 30C, and 30D are covered with the resist film, the resist film may have a plurality of openings as in the configuration described above.

Third Embodiment

Figure 11:
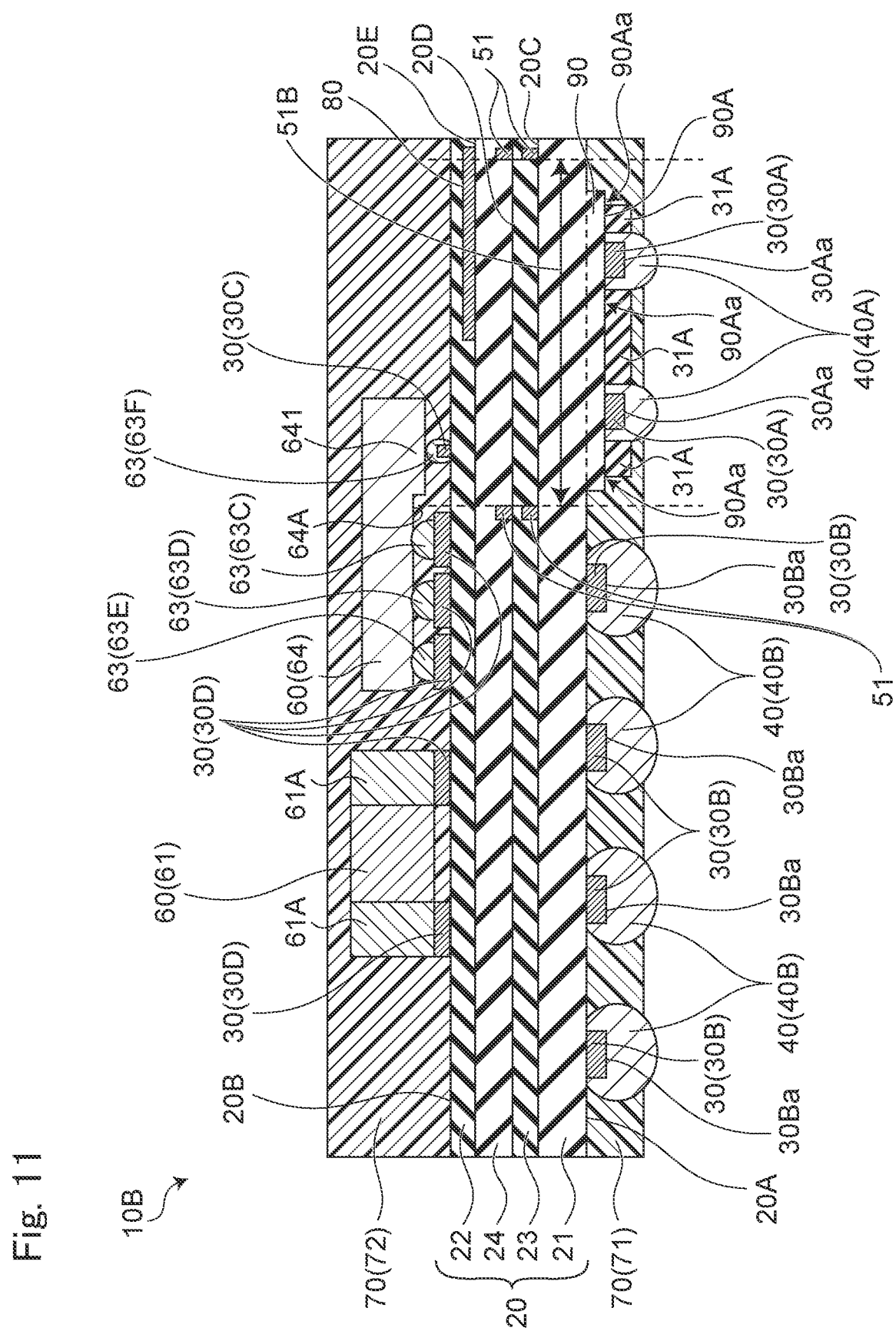
FIG. 11 is a cross-sectional view illustrating a cross section of a wiring board according to a third embodiment of the present disclosure at a position corresponding to a B-B cross section in FIG. 7.

FIG. 11 is a cross-sectional view illustrating a cross section of the wiring board according to a third embodiment of the present disclosure at a position corresponding to the B-B cross section in FIG. 7. A wiring board 10B according to the third embodiment is different from the wiring board 10A according to the second embodiment in that an electronic component 64 is provided instead of the electronic component 62.

In the third embodiment, the electronic component 64 includes four solder balls 63. The four solder balls 63 are solder balls 63C, 63D, 63E, and 63F. That is, the electronic component 64 is different from the electronic component 62 (see FIG. 8) in that the electronic component 64 includes solder balls 63F instead of the solder balls 63A and 63B.

The solder ball 63F is at a position overlapping the opening 51B of the coil conductor 51 in plan view of the wiring board 10B as viewed from the upper surface 20B side of the insulating layer 20. That is, a part of the electronic component 64 overlaps the opening 51B of the coil conductor 51 in the plan view. The electronic component 64 is an example of the overlapping component. On the other hand, similarly to the second embodiment, the solder balls 63C, 63D, and 63E are at positions deviated from the opening 51B of the coil conductor 51 in the plan view.

The solder ball 63F is electrically connected to the electrode 30C. Similarly to the second embodiment, the solder balls 63C, 63D, and 63E are electrically connected to the electrode 30D.

The solder ball 63F is smaller than each of the solder balls 63C, 63D, and 63E. The solder ball 63 has a substantially spherical shape. Therefore, in plan view of the wiring board 10B viewed from the upper surface 20B side of the insulating layer 20, the area of the solder ball 63F is smaller than the area of each of the solder balls 63C, 63D, and 63E.

In plan view of the wiring board 10B as viewed from the upper surface 20B side of the insulating layer 20, the solder ball 63F is larger than the area of the electrode 30C. In the present embodiment, the entire portion of the electrode 30C overlaps the solder ball 63F in the plan view.

In the third embodiment, the electronic component 64 includes a protrusion 641 in order to align the lower end portions of the solder balls 63F and the solder balls 63C, 63D, and 63E having different sizes in the vertical direction. The protrusion 641 protrudes downward from a lower surface 64A of the electronic component 64. The solder ball 63F is formed on the tip surface of the protrusion 641 (the lower surface of the protrusion 641). As a result, the lower end portion of the solder ball 63F is positioned downward by the amount corresponding to the protrusion 641. On the other hand, the solder balls 63C, 63D, and 63E are formed on the lower surface 64A. The protrusion length of the protrusion 641 is substantially the same as the difference between the diameters of the solder balls 63C, 63D, and 63E and the diameter of the solder ball 63F. Therefore, since the solder ball 63F is formed on the protrusion 641, the position of the lower end portion of the solder ball 63F in the vertical direction is substantially the same as the positions of the lower end portions of the solder balls 63C, 63D, and 63E in the vertical direction.

The configuration for aligning the lower end portions of the solder ball 63F and the solder balls 63C, 63D, and 63E having different sizes in the vertical direction is not limited to the protrusion 641. For example, the electronic component 64 may include a recess on the lower surface of the electronic component 64, and the solder balls 63C, 63D, and 63E may be formed in the recess.

According to the third embodiment, in plan view of the wiring board 10A as viewed from the upper surface 20B side of the insulating layer 20, the electrode 30C is at a position overlapping the opening 51B of the coil conductor 51. Therefore, the solder ball 63F connected to the electrode 30C can greatly affect the magnetic flux formed by the coil conductor 51. On the other hand, in the plan view, the electrode 30D is at a position deviated from the opening 51B of the coil conductor 51. Therefore, the solder balls 63C, 63D, and 63E connected to the electrode 30D do not greatly affect the magnetic flux formed by the coil conductor 51.

According to the third embodiment, in plan view of the wiring board 10A as viewed from the upper surface 20B side of the insulating layer 20, the area of the solder balls 63F connected to the electrodes 30C is smaller than the areas of the solder balls 63C, 63D, and 63E connected to the electrodes 30D. Therefore, when there is a variation in size of the solder ball 63, the variation in size of the solder ball 63F connected to the electrode 30C can be made smaller than the variation in size of the solder balls 63C, 63D, and 63E connected to the electrode 30D. Therefore, the influence of the variation in size of the solder ball 63F on the magnetic flux formed by the coil conductor 51 can be reduced.

According to the third embodiment, when viewed from the coil conductor 51, a part of the solder ball 63F connected to the electrode 30C is located outside the electrode 30C. Therefore, the influence of the variation in size of the solder ball 63F connected to the electrode 30C on the magnetic flux formed by the coil conductor 51 increases.

However, in the third embodiment, since the area of the solder ball 63F connected to the electrode 30C is smaller than the areas of the solder balls 63C, 63D, and 63E connected to the electrode 30D in plan view of the wiring board 10A as viewed from the upper surface 20B side of the insulating layer 20, the influence of the variation in size of the solder ball 63F connected to the electrode 30C on the magnetic flux formed by the coil conductor 51 is reduced.

In the third embodiment, the ground conductor 80 covers only a part of the opening 51B of the coil conductor 51, but may cover the entire opening 51B.

Fourth Embodiment

Figure 12:
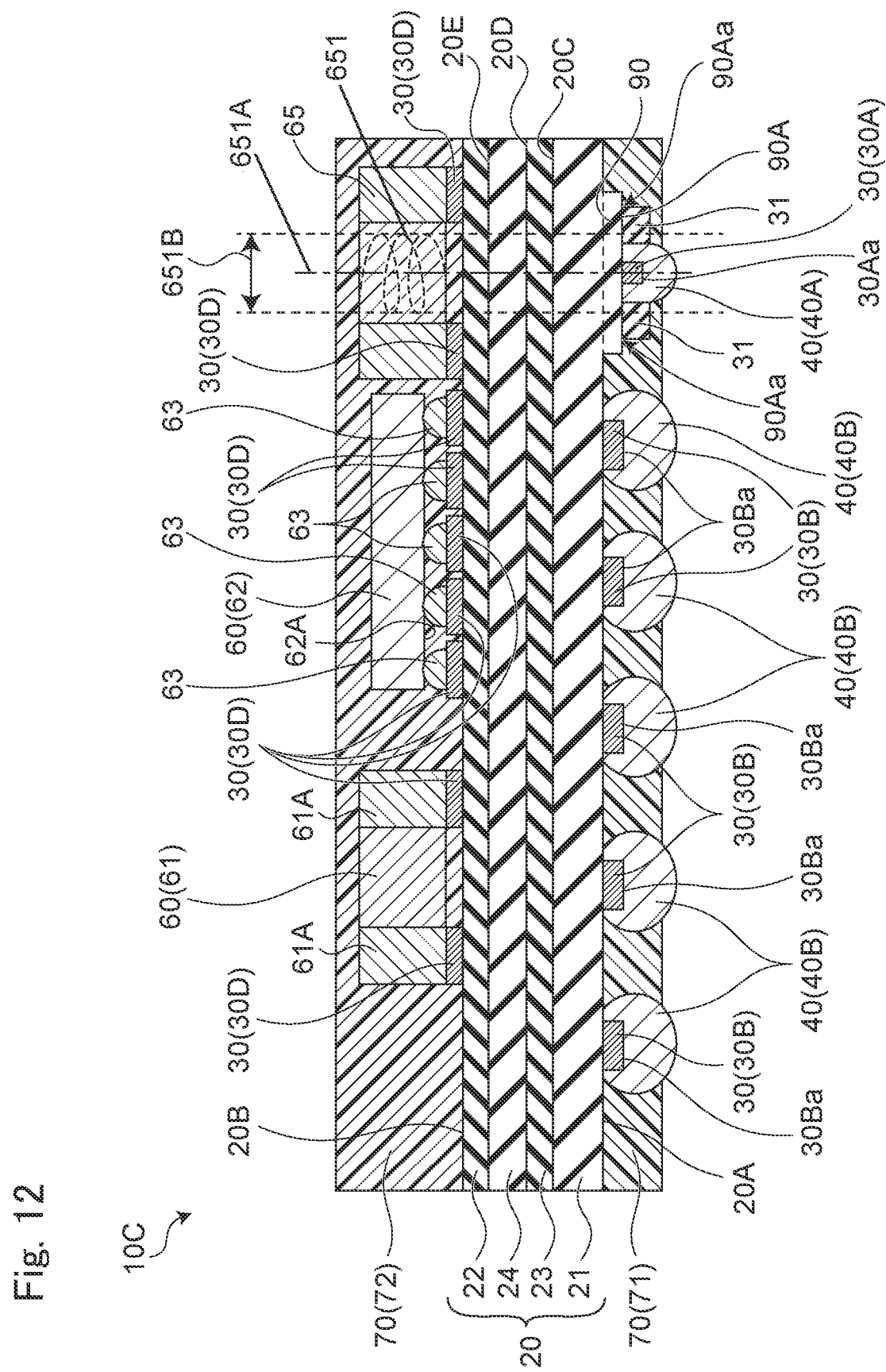
FIG. 12 is a cross-sectional view illustrating a cross section of a wiring board according to a fourth embodiment of the present disclosure at a position corresponding to an A-A cross section in FIG. 1.

FIG. 12 is a cross-sectional view illustrating a cross section of a wiring board according to a fourth embodiment of the present disclosure at a position corresponding to an A-A cross section in FIG. 1. A wiring board 10C according to the fourth embodiment is different from the wiring board 10 according to the first embodiment in that an electronic component 65 as a coil conductor is provided instead of the coil conductor 50.

The wiring board 10C includes, as the electronic component 60, the electronic component 65 in addition to the electronic components 61 and 62. The electronic component 65 is mounted on the upper surface 20B of the insulating layer 20. The electronic component 65 has a coil 651 therein.

That is, in the fourth embodiment, the electronic component 65 corresponds to a coil conductor.

Although not illustrated, one end portion and the other end portion of the coil 651 are electrically connected to the electrode 30D formed on the upper surface 20B of the insulating layer 20 of the wiring board 10C.

A winding axis 651A of the coil 651 intersects the lower surface 20A and the upper surface 20B of the insulating layer 20.

The coil 651 has an opening 651B. The opening 651B is a region inside the coil 651 having a loop shape in plan view of the wiring board 10 as viewed from the lower surface 20A side of the insulating layer 20.

In plan view of the wiring board 10C as viewed from the lower surface 20A side of the insulating layer 20, the entire solder ball 40A is at a position overlapping the opening 651B of the coil 651. Note that, in the plan view, a part of the solder ball 40A may be located at a position overlapping the opening 651B of the coil 651.

Fifth Embodiment

FIG. 13 is a cross-sectional view illustrating a cross section of the wiring board according to a fifth embodiment of the present disclosure at a position corresponding to the A-A cross section in FIG. 1. A wiring board 10D according to the fifth embodiment is different from the wiring board 10 according to the first embodiment in that a solder ball 40C is further provided.

In the fifth embodiment, as illustrated in FIG. 13, the insulating layer 20 does not include the stepped portion 90.

The electrode 30A is formed on the lower surface 20A of the insulating layer 20 similarly to the electrode 30B.

The insulating resist film 31 is formed on the lower surface 20A of the insulating layer 20. Specifically, the resist film 31 covers a peripheral portion 20Aa of the electrode 30A on the lower surface 20A of the insulating layer 20. The peripheral portion 20Aa is a peripheral portion outside the side of the square constituting the electrode 30A.

The wiring board 10D includes seven solder balls 40. The solder ball 40 has a substantially spherical shape.

The seven solder balls 40 include one solder ball 40A, five solder balls 40B, and one solder ball 40C. The solder ball 40C is an example of a third conductive member.

Similarly to the first embodiment, the solder ball 40A is formed on the front surface 30Aa of the electrode 30A. The solder ball 40B is formed on the front surface 30Ba of the electrode 30B.

Similarly to the first embodiment, the solder ball 40A is smaller than the solder ball 40B.

The solder ball 40C is formed on a side of the solder ball 40A opposite to the electrode 30A. The solder ball 40C is electrically connected to the solder ball 40A.

In the present exemplary embodiment, the solder ball 40C has the same shape as the solder ball 40A in plan view of the wiring board 10 as viewed from the lower surface 20A of the insulating layer 20. However, in plan view of the wiring board 10 as viewed from the lower surface 20A of the insulating layer 20, the solder ball 40C may have a shape different from a shape of the solder ball 40A. In addition, the solder ball 40C may be larger than the solder ball 40A, may be smaller than the solder ball 40A, or may have the same size as the solder ball 40A.

The diameter of the solder ball 40C is substantially the same as the difference between the diameter of the solder ball 40A and the diameter of the solder ball 40B. Therefore, since the solder ball 40C is formed on a side of the solder ball 40A opposite to the insulating layer 20, the position of the lower end portion of the solder ball 40C in the vertical direction is substantially the same as the position of the lower end portion of the solder ball 40B in the vertical direction.

In the present embodiment, as illustrated in FIG. 13, the sealing resin 71 covers a part of the solder ball 40A and a part of the solder ball 40B. On the other hand, the solder ball 40C is not covered with the sealing resin 71 and is exposed to the outside. However, the sealing resin 71 may cover the entire solder ball 40A. In addition, similarly to the solder ball 40A shown in FIG. 2, the solder ball 40C may be covered with the sealing resin 71 except for the lower end portion.

According to the fifth embodiment, the wiring board 10B includes the solder balls 40C formed on a side of the solder balls 40A opposite to the electrodes 30A. As a result, even when the thickness of the solder ball 40A is smaller than the thickness of the solder ball 40B, the position of the portion of the solder ball 40C farthest from the lower surface 20A and the position of the portion of the solder ball 40B farthest from the lower surface 20A can be aligned in the direction orthogonal to the lower surface 20A of the insulating layer 20. Therefore, the possibility of occurrence of mounting failure can be reduced.

In the fifth embodiment, the solder ball 40C corresponds to a third conductive member. However, the conductive member only needs to have conductivity, and is not limited to the solder ball 40. In addition, the third conductive member may be a conductive member having the same composition as that of the first conductive member, or may be a conductive member having a different composition.

Note that, by appropriately combining arbitrary embodiments among the various embodiments described above, the effects of the respective embodiments can be achieved.

Although the present disclosure has been sufficiently described in connection with preferred embodiments with reference to the drawings as appropriate, various modifications and corrections are apparent to those skilled in the art. Such variations and modifications should be understood to be included within the scope of the present disclosure according to the appended claims as long as they do not depart therefrom.

10 wiring board
20 insulating layer
20A lower surface (first surface)
20Aa peripheral portion
20B upper surface (second surface)
30 land electrode
30A electrode
30Aa surface
30B electrode
30Ba surface
30C electrode (overlapping electrode)
30Ca outer edge portion
30D electrode (non-overlapping electrode)
31 resist film (covering portion)
40 solder ball (conductive member)
40A solder ball (first conductive member)
40B solder ball (second conductive member)
40C solder ball (third conductive member)
50 coil conductor
50A winding axis
50B opening
60 electronic component
61 electronic component (non-overlapping component)
62 electronic component (overlapping component)

63 solder ball (conductive portion)
71 sealing resin (first sealing resin)
72 sealing resin (second sealing resin)
90 stepped portion
90A surface
90Aa peripheral portion
91 spacer

The invention claimed is:

1. A wiring board comprising:
at least one insulating layer having a first surface and a second surface opposite to the first surface;
a plurality of conductive members;
at least one land electrode formed at a position overlapping the first surface in plan view of the insulating layer as viewed from a first surface side of the insulating layer, the at least one land electrode being connected to each of the at least one conductive member; and
a coil conductor provided inside the insulating layer or on the second surface of the insulating layer and having a winding axis intersecting the first surface, wherein
the plurality of conductive members comprises:
at least one first conductive member located at a position where at least a part of the first conductive member overlaps an opening of the coil conductor in plan view seen from the first surface side; and
a second conductive member located at a position deviated from the opening of the coil conductor in plan view seen from the first surface side, and
an area of the first conductive member is smaller than an area of the second conductive member in plan view seen from the first surface side.

2. A wiring board according to claim 1, wherein, in plan view seen from the first surface side, an area of the first conductive member is smaller than an area of the opening of the coil conductor.

3. A wiring board according to claim 2, wherein, in plan view seen from the first surface side, an area of the first conductive member is larger than an area of the land electrode to which the first conductive member is connected.

4. A wiring board according to claim 2, further comprising an insulating covering portion surrounding the land electrode to which the first conductive member is connected in plan view seen from the first surface side, wherein
the first conductive member is surrounded by the covering portion in plan view seen from the first surface side.

5. A wiring board according to claim 2, wherein a distance between a surface of the land electrode to which the first conductive member is connected and the first surface is longer than a distance between a surface of the land electrode to which the second conductive member is connected and the first surface.

6. A wiring board according to claim 2, further comprising a third conductive member formed on a side of the first conductive member opposite to the land electrode.

7. A wiring board according to claim 1, wherein, in plan view seen from the first surface side, an area of the first conductive member is larger than an area of the land electrode to which the first conductive member is connected.

8. A wiring board according to claim 7, further comprising an insulating covering portion surrounding the land electrode to which the first conductive member is connected in plan view seen from the first surface side, wherein
the first conductive member is surrounded by the covering portion in plan view seen from the first surface side.

9. A wiring board according to claim 7, wherein a distance between a surface of the land electrode to which the first conductive member is connected and the first surface is longer than a distance between a surface of the land electrode to which the second conductive member is connected and the first surface.

10. A wiring board according to claim 1, further comprising an insulating covering portion surrounding the land electrode to which the first conductive member is connected in plan view seen from the first surface side, wherein
the first conductive member is surrounded by the covering portion in plan view seen from the first surface side.

11. A wiring board according to claim 10, wherein a distance between a surface of the land electrode to which the first conductive member is connected and the first surface is longer than a distance between a surface of the land electrode to which the second conductive member is connected and the first surface.

12. A wiring board according to claim 1, wherein a distance between a surface of the land electrode to which the first conductive member is connected and the first surface is longer than a distance between a surface of the land electrode to which the second conductive member is connected and the first surface.

13. A wiring board according to claim 1, further comprising a third conductive member formed on a side of the first conductive member opposite to the land electrode.

14. A wiring board according to claim 1, wherein the at least one first conductive member comprises a plurality of first conductive members at positions overlapping the opening of the coil conductor in plan view seen from the first surface side.

15. A wiring board according to claim 1, further comprising a first sealing resin provided on the first surface of the insulating layer and covering a part of the conductive member.

16. A wiring board according to claim 1, further comprising at least one electronic component mounted on the second surface of the insulating layer.

17. A wiring board according to claim 16, further comprising a second sealing resin provided on the second surface of the insulating layer and covering at least a part of the electronic component.

18. A wiring board according to claim 16, wherein
the coil conductor is provided inside the insulating layer, and
the electronic component is located at a position deviated from the opening of the coil conductor in plan view seen from a second surface side.

19. A wiring board according to claim 16, wherein the at least one land electrode comprises a plurality of land electrodes,
wherein the coil conductor is provided inside the insulating layer,
the electronic component comprises:
an overlapping component at least partially overlapping the opening of the coil conductor in plan view seen from the second surface side, and
a non-overlapping component located at a position deviated from the opening of the coil conductor in plan view seen from a second surface side,
each of the overlapping component and the non-overlapping component comprises at least one conductive portion exposed to an outside,
the plurality of land electrodes further comprise:
an overlapping electrode formed on the second surface of the insulating layer, located at a position overlapping the opening of the coil conductor in plan view seen from the second surface side, and connected with the conductive portion of the overlapping component; and a non-overlapping electrode formed on the second surface of the insulating layer, located at a position deviated from the opening of the coil conductor in plan view seen from the second surface side, and connected with the conductive portion of the overlapping component located at a position deviated from the opening of the coil conductor or the conductive portion of the non-overlapping component, in plan view seen from the second surface side, an area of the conductive portion connected to the overlapping electrode is smaller than an area of the conductive portion connected to the non-overlapping electrode.

20. A wiring board according to claim 19, wherein, in plan view seen from the second surface side, an area of the conductive portion connected to the overlapping electrode is larger than an area of the overlapping electrode.

* * * * *